US012615863B2

(12) United States Patent
Park et al.

(10) Patent No.: US 12,615,863 B2

(45) Date of Patent: Apr. 28, 2026

(54) IMAGE SENSOR HAVING AN ACTIVE PATTERN OF METAL OXIDE SEMICONDUCTOR DOPED WITH NITROGEN DISPOSED ON A HYDROGEN BLOCKING LAYER

(71) Applicant: SAMSUNG ELECTRONICS CO., LTD., Suwon-si (KR)

(72) Inventors: Jin-Seong Park, Seoul (KR); Sanghoon Uhm, Yongin-si (KR); Taeksoo Jeon, Hwaseong-si (KR); Dong-Gyu Kim, Seoul (KR); Yoon-Seo Kim, Seoul (KR); Hyun-Jun Jeong, Seoul (KR)

(73) Assignees: SAMSUNG ELECTRONICS CO., LTD., Suwon-si (KR); IUCF-HYU (Industry-University Cooperation Foundation Hanyang University), Seoul (KR)

( * ) Notice: Subject to any disclaimer, the term of this patent is extended or adjusted under 35 U.S.C. 154(b) by 787 days.

(21) Appl. No.: 17/575,874

(22) Filed: Jan. 14, 2022

(65) Prior Publication Data

US 2022/0384502 A1 Dec. 1, 2022

(30) Foreign Application Priority Data

May 10, 2021 (KR) ........................ 10-2021-0060032

(51) Int. Cl.

*H10F 39/00* (2025.01)
*H10D 30/67* (2025.01)
*H10D 86/40* (2025.01)

(52) U.S. Cl.

CPC ... *H10F 39/80377* (2025.01); *H10D 30/6755* (2025.01); *H10D 86/423* (2025.01); *H10F 39/014* (2025.01)

(58) Field of Classification Search

CPC ......... H01L 27/14616; H01L 27/14643; H01L 27/14689; H10D 30/6755; H10D 86/423; H10F 39/014; H10F 39/80377

See application file for complete search history.

(56) References Cited

U.S. PATENT DOCUMENTS 7,250,379 B2 7/2007 Lee et al.
7,851,380 B2 12/2010 Nelson et al.
(Continued)

FOREIGN PATENT DOCUMENTS

KR 10-2010-0055655 5/2010
KR 10-2012-0097401 A 9/2012
(Continued)

OTHER PUBLICATIONS

Jiazhen Sheng et al, "A Study on the Electrical Properties of Atomic Layer Deposition Grown InOx on Flexible Substrates with Respect to N2O Plasma Treatment and the Associated Thin-Film Transistor Behavior under Repetitive Mechanical Stress", ACS Appl. Mater. Interfaces 2016, 8, 31136-31143.
(Continued)

*Primary Examiner* — Anh D Mai

(74) *Attorney, Agent, or Firm* — Morgan, Lewis & Bockius LLP

(57) ABSTRACT

An image sensor includes a substrate including a plurality of pixels and having a first surface and a second surface opposite to the first surface, a photoelectric conversion portion disposed in the substrate in each of the pixels, a transfer gate disposed on the first surface of the substrate in each of the pixels, a first interlayer insulating layer covering the substrate and the transfer gate, a first hydrogen blocking layer disposed on the first interlayer insulating layer, a first active pattern disposed on the first hydrogen blocking layer and including a metal oxide doped with nitrogen, a first gate disposed on the first active pattern, a second interlayer (Continued)

insulating layer covering the first gate and the first active pattern, and upper source/drain contacts penetrating the second interlayer insulating layer and contacting the first active pattern at two sides of the first gate.

13 Claims, 31 Drawing Sheets

(56) References Cited

U.S. PATENT DOCUMENTS

| | | | |
|---|---|---|---|
| 7,875,559 B2 | 1/2011 | Park et al. | |
| 8,207,063 B2 | 6/2012 | Cowdery-Corvan et al. | |
| 8,258,023 B2 | 9/2012 | Lee | |
| 10,608,034 B2 | 3/2020 | Endo et al. | |
| 2008/0224133 A1 | 9/2008 | Park et al. | |
| 2011/0155893 A1* | 6/2011 | Endo | H01L 27/14632 257/292 |
| 2015/0372122 A1* | 12/2015 | Hodo | H01L 21/32136 438/104 |
| 2016/0037098 A1* | 2/2016 | Lee | H10K 39/32 257/292 |
| 2019/0371848 A1* | 12/2019 | Ikeda | H01L 27/1229 |
| 2020/0203432 A1 | 6/2020 | Rachmady et al. | |

FOREIGN PATENT DOCUMENTS

| | | |
|---|---|---|
| KR | 10-1263239 | 6/2013 |
| KR | 10-2017-0142982 | 12/2017 |

OTHER PUBLICATIONS

Cheng-Chao Pan et al, "Improvement in Bias Stability of IGZO TFT With Etching Stop Structure by UV Irradiation Treatment of Active Layer Island", Electron Devices Society vol. 8, 2020.

Office Action dated May 1, 2025 issued in corresponding Korean Patent Application No. 10-2021-0060032.

* cited by examiner

IMAGE SENSOR HAVING AN ACTIVE PATTERN OF METAL OXIDE SEMICONDUCTOR DOPED WITH NITROGEN DISPOSED ON A HYDROGEN BLOCKING LAYER

CROSS-REFERENCE TO RELATED APPLICATION

This U.S. non-provisional patent application claims priority under 35 U.S.C. § 119 to Korean Patent Application No. 10-2021-0060032, filed on May 10, 2021 in the Korean Intellectual Property Office, the disclosure of which is hereby incorporated by reference in its entirety.

TECHNICAL FIELD

Embodiments of the inventive concept relate to an image sensor, a semiconductor device and a method of manufacturing the same, and more particularly, to an image sensor and a semiconductor device, each of which includes a metal oxide semiconductor layer doped with nitrogen, and a method of manufacturing the same.

DISCUSSION OF RELATED ART

An image sensor is a semiconductor device that converts an optical image into electrical signals. An image sensor may be categorized as a charge coupled device (CCD) image sensor or a complementary metal-oxide-semiconductor (CMOS) image sensor (CIS). A CIS may include a plurality of two-dimensionally arranged pixels. Each of the pixels may include a photodiode, which may convert incident light into an electrical signal.

SUMMARY

Embodiments of the inventive concept may provide a highly integrated image sensor with increased reliability.

Embodiments of the inventive concept may also provide a method of manufacturing a highly integrated image sensor with increased reliability.

Embodiments of the inventive concept may also provide a semiconductor device with increased reliability.

Embodiments of the inventive concept may also provide a method of forming a metal oxide semiconductor layer having a nitrogen doping profile which is uniform regardless of location.

In an embodiment of the inventive concept, an image sensor includes a substrate including a plurality of pixels and having a first surface and a second surface opposite to the first surface, a photoelectric conversion portion disposed in the substrate in each of the pixels, a transfer gate disposed on the first surface of the substrate in each of the pixels, a first interlayer insulating layer covering the substrate and the transfer gate, a first hydrogen blocking layer disposed on the first interlayer insulating layer, a first active pattern disposed on the first hydrogen blocking layer and including a metal oxide doped with nitrogen, a first gate disposed on the first active pattern, a second interlayer insulating layer covering the first gate and the first active pattern, and upper source/drain contacts penetrating the second interlayer insulating layer and contacting the first active pattern at both sides of the first gate.

In an embodiment of the inventive concept, an image sensor includes a substrate including a plurality of pixels and having a first surface and a second surface opposite to the first surface, a photoelectric conversion portion disposed in the substrate in each of the pixels, a transfer gate and a source follower gate which are disposed on the first surface of the substrate in each of the pixels, a first interlayer insulating layer covering the substrate, the transfer gate, and the source follower gate, a first hydrogen blocking layer disposed on the first interlayer insulating layer, a first active pattern and a second active pattern which are disposed on the first hydrogen blocking layer and are spaced apart from each other, the first and second active patterns including a metal oxide doped with nitrogen, a first gate disposed on the first active pattern, a second gate disposed on the second active pattern, a second interlayer insulating layer covering the first gate, the second gate, the first active pattern, and the second active pattern, first upper source/drain contacts penetrating the second interlayer insulating layer and contacting the first active pattern at both sides of the first gate, and second upper source/drain contacts penetrating the second interlayer insulating layer and contacting the second active pattern at both sides of the second gate.

In an embodiment of the inventive concept, an image sensor includes a substrate including a plurality of pixels and having a first surface and a second surface opposite to the first surface, a pixel isolation portion disposed in the substrate and isolating the pixels from each other, a photoelectric conversion portion disposed in the substrate in each of the pixels, a transfer gate disposed on the first surface of the substrate in each of the pixels, a floating diffusion region disposed in the substrate at a side of the transfer gate in each of the pixels, a first interlayer insulating layer covering the substrate and the transfer gate, a first hydrogen blocking layer disposed on the first interlayer insulating layer, a first active pattern disposed on the first hydrogen blocking layer, the first active pattern including a metal oxide doped with nitrogen, a first gate disposed on the first active pattern, a second interlayer insulating layer covering the first gate and the first active pattern, and upper source/drain contacts penetrating the second interlayer insulating layer and contacting the first active pattern at both sides of the first gate. A difference between a content of the nitrogen at a top end of the first active pattern and a content of the nitrogen at a bottom end of the first active pattern may be within a range from about 0.0 at % to about 0.1 at %.

In an embodiment of the inventive concept, a method of manufacturing an image sensor includes sequentially stacking a first interlayer insulating layer and a hydrogen blocking layer on a substrate including a plurality of pixels, forming a metal oxide semiconductor layer doped with nitrogen on the hydrogen blocking layer, forming an active pattern by etching the metal oxide semiconductor layer, forming a first device isolation layer at a side of the active pattern, forming a first gate electrode on the active pattern, and forming source/drain contacts on the active pattern at both sides of the first gate electrode. Forming the metal oxide semiconductor layer doped with nitrogen may include repeating a process cycle a plurality of times. The process cycle may include forming a first atomic layer including first metal atoms by supplying a first metal precursor, and forming a second atomic layer including oxygen atoms and nitrogen atoms by supplying a $N_2O$ gas.

In an embodiment of the inventive concept, a semiconductor device includes a first interlayer insulating layer and a first hydrogen blocking layer sequentially stacked on a substrate, an active pattern disposed on the first hydrogen blocking layer, the active pattern including a metal oxide doped with nitrogen, a gate electrode disposed on the active pattern, and source/drain contacts disposed on the active pattern at both sides of the gate electrode. A content of the nitrogen in the active pattern may be within a range from about 0.1 at % to about 5.0 at %.

In an embodiment of the inventive concept, a method of forming a semiconductor layer includes repeating a process cycle a plurality of times on a substrate to form a metal oxide semiconductor layer doped with nitrogen. The process cycle includes forming a first atomic layer including first metal atoms by supplying a first metal precursor, and forming a second atomic layer including oxygen atoms and nitrogen atoms by supplying a $N_2O$ gas.

BRIEF DESCRIPTION OF THE DRAWINGS

The above and other features of the inventive concept will become more apparent by describing in detail embodiments thereof with reference to the accompanying drawings, in which.

DETAILED DESCRIPTION OF THE EMBODIMENTS

Figure 1A:
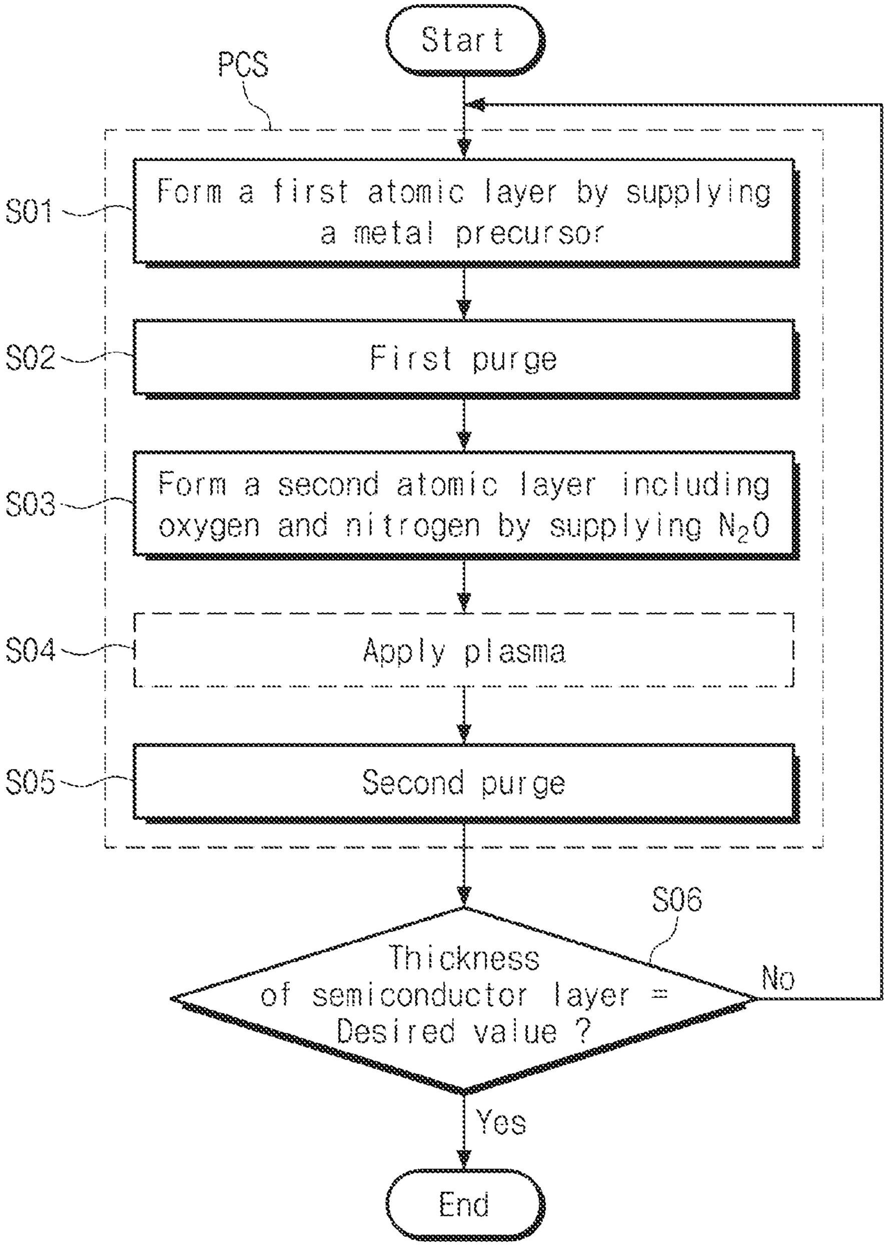
FIG. 1A is a flowchart illustrating a method of forming a semiconductor layer according to some embodiments of the inventive concept.

Embodiments of the inventive concept will be described more fully hereinafter with reference to the accompanying drawings. Like reference numerals may refer to like elements throughout the accompanying drawings.

In the present specification, it will be understood that although the terms "first", "second", etc. may be used to distinguish components performing the same/similar functions, these components should not be limited by these terms. Thus, a first component in some embodiments could be termed as a second component in other embodiments without departing from the teachings of the inventive concept.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when one value is described as being about equal to another value or being substantially the same as or equal to another value, it is to be understood that the values are identical, the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about"

a certain value, according to embodiments, the parameter may be exactly the certain value or approximately the certain value within a measurement error as would be understood by a person having ordinary skill in the art. Other words used to describe the relationships between components should be interpreted in a like fashion. For example, when elements are described as being substantially coplanar or substantially aligned with one another, it is to be understood that elements are exactly coplanar or exactly aligned with one another, or almost coplanar or almost aligned with one another (e.g., within a measurement error), as would be understood by a person having ordinary skill in the art.

Figure 1B:
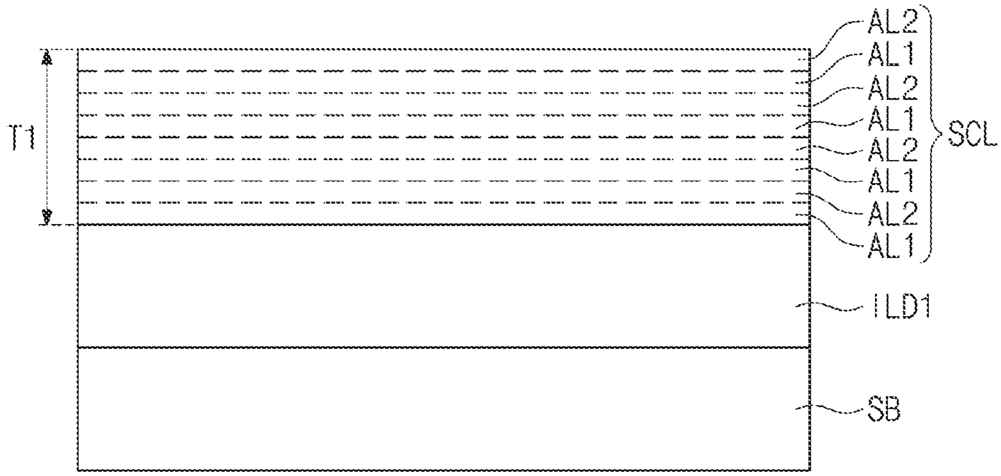
FIG. 1B is a cross-sectional view illustrating a method of forming a semiconductor layer according to some embodiments of the inventive concept.

FIG. 1A is a flowchart illustrating a method of forming a semiconductor layer according to some embodiments of the inventive concept. FIG. 1B is a cross-sectional view illustrating a method of forming a semiconductor layer according to some embodiments of the inventive concept.

Referring to FIGS. 1A and 1B, a substrate SB may be prepared. The substrate SB may be, for example, a single-crystalline wafer or epitaxial layer including silicon and/or germanium, or a silicon-on-insulator (SOI) substrate. An interlayer insulating layer ILD1 may be formed on the substrate SB. For example, the interlayer insulating layer ILD1 may be formed of a single layer or multi-layer including at least one of a silicon oxide layer, a silicon nitride layer, a silicon oxynitride layer, a SiOCH layer, a tetraethyl orthosilicate (TEOS) layer, or a porous insulating layer. A metal oxide semiconductor layer SCL doped with nitrogen may be formed on the interlayer insulating layer ILD1. The semiconductor layer SCL may be formed by, for example, an atomic layer deposition (ALD) process, a plasma-enhanced ALD (PEALD) process, a chemical vapor deposition (CVD) process, or a plasma-enhanced CVD (PECVD) process. In some embodiments, the formation of the semiconductor layer SCL may include repeating a process cycle PCS a plurality of times, as illustrated in FIG. 1A.

The process cycle PCS may include an operation S01 of forming a first atomic layer by supplying a metal precursor, a first purge operation S02, an operation S03 of forming a second atomic layer including oxygen and nitrogen by supplying $N_2O$, an operation S04 of applying plasma, and a second purge operation S05.

In the operation S01 of forming the first atomic layer by supplying the metal precursor, the metal precursor may be supplied onto the interlayer insulating layer ILD1 to form a first atomic layer AL1 formed of metal atoms. The first atomic layer AL1 may be formed with a thickness substantially corresponding to a size of a single metal atom. The metal precursor may include the metal atom and a plurality of ligands combined with the metal atom. For example, the ligands may include at least one of an alkyl group, an alkenyl group, an alkynyl group, or an amino group. For example, the metal precursor may include at least one metal of In, Ga, Zn, or Sn. In some embodiments, the metal precursor may include Sn and may be tetrakis(dimethylamido)tin(IV) [TDMASn] represented by the following chemical structural formula 1. In some embodiments, the metal precursor may include Ga and may be trimethylgallium (TMGa) represented by the following chemical structural formula 2. In some embodiments, the metal precursor may include In and may be (3-(dimethylamino)propyl)dimethyl indium [DADI] represented by the following chemical structural formula 3. In some embodiments, the metal precursor may include Zn and may be di-methylzinc (DMZ; $Zn(CH_3)_2$) or diethylzinc (DEZ; $Zn(C_2H_5)_2$).

[Chemical structural formula 1]

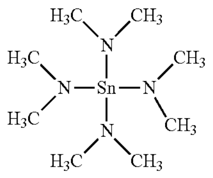

[Chemical structural formula 2]

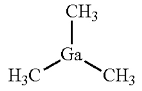

[Chemical structural formula 3]

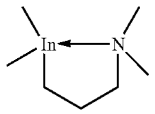

In the first purge operation S02, a remaining metal precursor that does not react with a surface of the interlayer insulating layer ILD1 may be purged. In the operation S03 of forming the second atomic layer including oxygen and nitrogen by supplying $N_2O$, the supplied $N_2O$ may be decomposed into oxygen atoms and nitrogen atoms, and the oxygen atoms and the nitrogen atoms may react with the metal atoms of the first atomic layer AL1 to form a second atomic layer AL2. At this time, a chemical affinity of the metal atoms for the oxygen atoms may be greater than a chemical affinity of the metal atoms for the nitrogen atoms, and thus, the oxygen atoms may be relatively easily combined with the metal atoms. A relatively small amount of the nitrogen atoms may be combined with the metal atoms. The $N_2O$ may be supplied in a gaseous form.

In the operation S04 of applying the plasma, the supplied $N_2O$ gas may become a plasma state, and thus, the $N_2O$ gas in the plasma state may be better combined with the metal atoms of the first atomic layer AL1. In some embodiments, the operation S04 of applying the plasma may be omitted. In the second purge operation S05, the $N_2O$ gas that does not react with the metal atoms may be purged. The operation S04 may be performed concurrently with the operation S03 in some embodiments.

After the process cycle PCS has been completed once, it may be determined whether a thickness T1 of the semiconductor layer SCL is a desired value (operation S06). If the thickness T1 of the semiconductor layer SCL is not the desired value, the process cycle PCS may be repeated again until the thickness T1 is the desired value. The semiconductor layer SCL formed as described above may be a metal oxide semiconductor layer including the metal, oxygen and nitrogen.

Figure 2A:
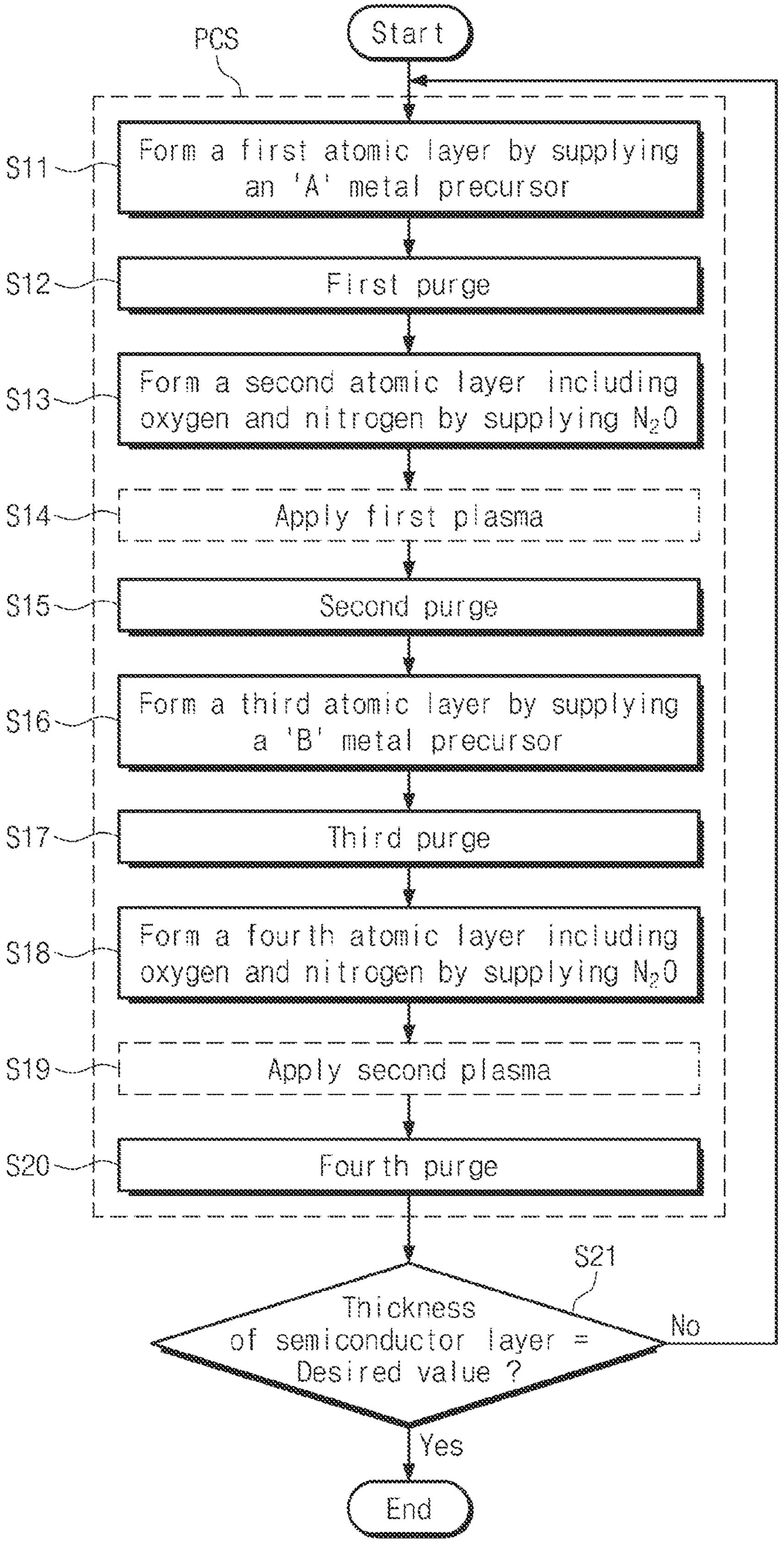
FIG. 2A is a flowchart illustrating a method of forming a semiconductor layer according to some embodiments of the inventive concept.
Figure 2B:
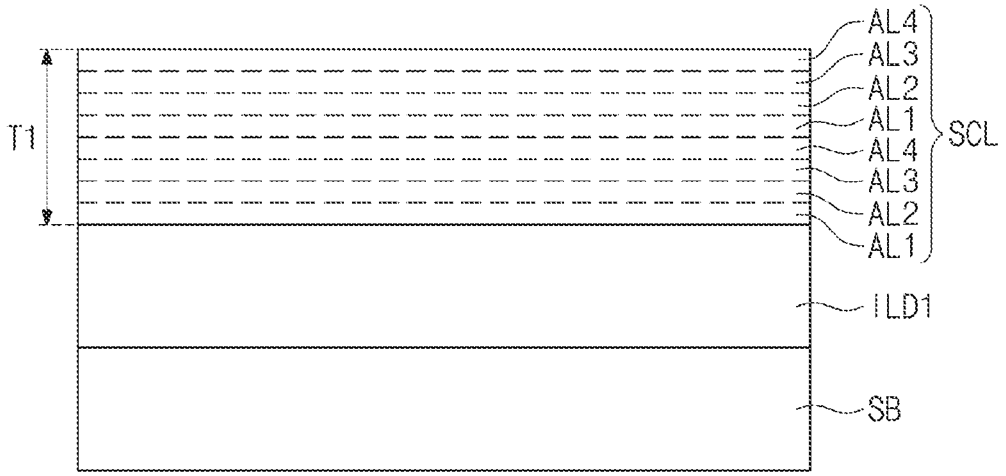
FIG. 2B is a cross-sectional view illustrating a method of forming a semiconductor layer according to some embodiments of the inventive concept.

FIG. 2A is a flowchart illustrating a method of forming a semiconductor layer according to some embodiments of the inventive concept. FIG. 2B is a cross-sectional view illustrating a method of forming a semiconductor layer according to some embodiments of the inventive concept.

Referring to FIGS. 2A and 2B, a method of forming a semiconductor layer SCL according to some embodiments may include repeating a process cycle PCS of FIG. 2A a plurality of times. The process cycle PCS may include an operation S11 of forming a first atomic layer by supplying an 'A' metal precursor, a first purge operation S12, an operation S13 of forming a second atomic layer including oxygen and nitrogen by supplying $N_2O$, an operation S14 of applying first plasma, a second purge operation S15, an operation S16 of forming a third atomic layer by supplying a 'B' metal precursor, a third purge operation S17, an operation S18 of forming a fourth atomic layer including oxygen and nitrogen by supplying $N_2O$, an operation S19 of applying second plasma, and a fourth purge operation S20.

In the operation S11 of forming the first atomic layer by supplying the 'A' metal precursor, the 'A' metal precursor may be supplied onto the interlayer insulating layer ILD1 to form a first atomic layer AL1 formed of 'A' metal atoms. The first atomic layer AL1 may be formed with a thickness substantially corresponding to a size of a single 'A' metal atom. The 'A' metal atom may be, for example, In, Ga, Zn, or Sn. The 'A' metal precursor may be one of the metal precursors described above.

In the first purge operation S12, a remaining 'A' metal precursor that does not react with a surface of the interlayer insulating layer ILD1 may be purged. In the operation S13 of forming the second atomic layer including oxygen and nitrogen by supplying $N_2O$, the supplied $N_2O$ may be decomposed into oxygen atoms and nitrogen atoms, and the oxygen atoms and the nitrogen atoms may react with the 'A' metal atoms of the first atomic layer AL1 to form a second atomic layer AL2. At this time, a chemical affinity of the 'A' metal atoms for the oxygen atoms may be greater than a chemical affinity of the 'A' metal atoms for the nitrogen atoms, and thus, the oxygen atoms may be relatively easily combined with the 'A' metal atoms. A relatively small amount of the nitrogen atoms may be combined with the 'A' metal atoms. The $N_2O$ may be supplied in a gaseous form.

In the operation S14 of applying the first plasma, the supplied $N_2O$ gas may become a plasma state, and thus, the oxygen atoms and the nitrogen atoms may be better combined with the 'A' metal atoms of the first atomic layer AL1. In some embodiments, the operation S14 of applying the first plasma may be omitted. In the second purge operation S15, the $N_2O$ gas that does not react with the 'A' metal atoms of the first atomic layer AL1 may be purged. The operation S14 may be performed concurrently with the operation S13 in some embodiments.

In the operation S16 of forming the third atomic layer by supplying the 'B' metal precursor, the 'B' metal precursor may be supplied onto the second atomic layer AL2 to form a third atomic layer AL3 formed of 'B' metal atoms. The 'B' metal atoms of the third atomic layer AL3 may be combined with the oxygen atoms and the nitrogen atoms of the second atomic layer AL2. The 'B' metal atom may be, for example, In, Ga, Zn, or Sn. The B' metal may be different from the 'A' metal. The 'B' metal precursor may be one of the metal precursors described above.

In the third purge operation S17, a remaining 'B' metal precursor not combined with the oxygen atoms and the nitrogen atoms of the second atomic layer AL2 may be purged. In the operation S18 of forming the fourth atomic layer including oxygen and nitrogen by supplying $N_2O$, the supplied $N_2O$ may be decomposed into oxygen atoms and nitrogen atoms, and the oxygen atoms and the nitrogen atoms may react with the 'B' metal atoms of the third atomic layer AL3 to form a fourth atomic layer AL4. At this time, a chemical affinity of the 'B' metal atoms for the oxygen atoms may be greater than a chemical affinity of the 'B' metal atoms for the nitrogen atoms, and thus, the oxygen atoms may be relatively easily combined with the 'B' metal atoms. A relatively small amount of the nitrogen atoms may be combined with the 'B' metal atoms. The $N_2O$ may be supplied in a gaseous form.

In the operation S19 of applying the second plasma, the supplied $N_2O$ gas may become a plasma state, and thus, the oxygen atoms and the nitrogen atoms may be better combined with the 'B' metal atoms of the third atomic layer AL3. In some embodiments, the operation S19 of applying the second plasma may be omitted. In the fourth purge operation S20, the $N_2O$ gas that does not react with the 'B' metal atoms may be purged. The operation S19 may be performed concurrently with the operation S18 in some embodiments.

After the process cycle PCS has been completed once, it may be determined whether a thickness T1 of the semiconductor layer SCL is a desired value (operation S21). If the thickness T1 of the semiconductor layer SCL is not the desired value, the process cycle PCS may be repeated again until the thickness T1 is the desired value. The semiconductor layer SCL formed as described above may be a metal oxide semiconductor layer including the 'A' metal, the 'B' metal, oxygen and nitrogen.

In some embodiments, after the fourth purge operation S20 is performed in FIG. 2A, the process cycle PCS may further include an operation of forming a fifth atomic layer by supplying a 'C' metal precursor, a purge operation of the 'C' metal precursor, an operation of forming a sixth atomic layer including oxygen and nitrogen by supplying $N_2O$, an operation of applying third plasma, and an $N_2O$ purge operation. The semiconductor layer SCL formed in this case may be a metal oxide semiconductor layer including the 'A' metal, the 'B' metal, the 'C' metal, oxygen and nitrogen. The 'C' metal may be different from the 'A' metal and the 'B' metal.

In addition, in some embodiments, after the $N_2O$ purge operation, the process cycle PCS may further include an operation of forming a seventh atomic layer by supplying a 'D' metal precursor, a purge operation of the 'D' metal precursor, an operation of forming an eighth atomic layer including oxygen and nitrogen by supplying $N_2O$, an operation of applying fourth plasma, and an $N_2O$ purge operation. The semiconductor layer SCL formed in this case may be a metal oxide semiconductor layer including the 'A' metal, the 'B' metal, the 'C' metal, the 'D' metal, oxygen and nitrogen. The 'D' metal may be different from the 'A' metal, the 'B' metal, and the 'C' metal.

Figure 3:
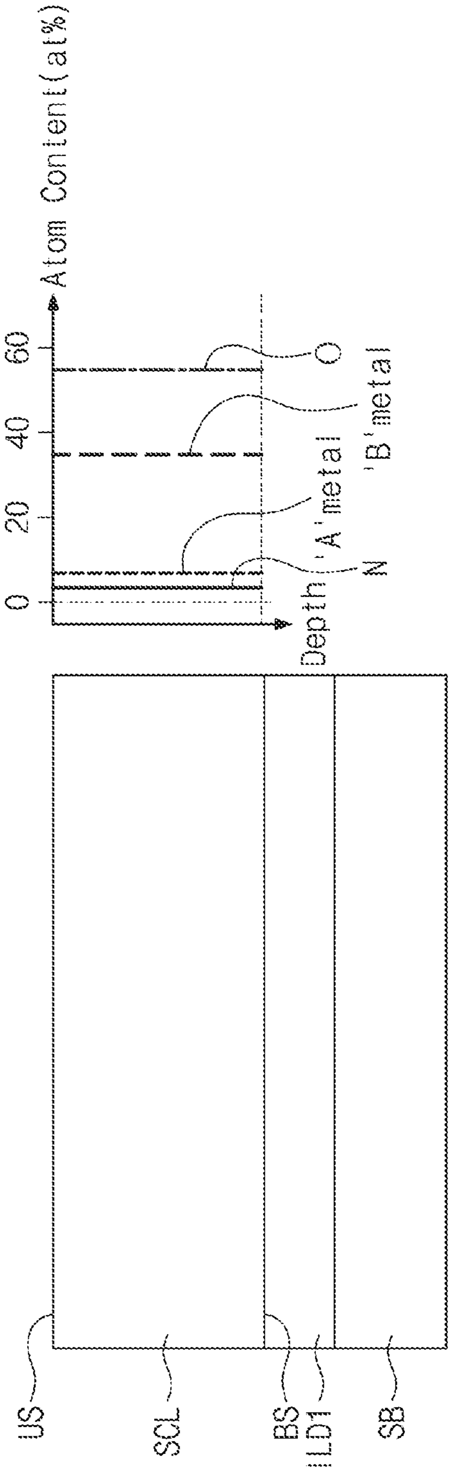
FIG. 3 is a graph showing contents of atoms included in a semiconductor layer according to some embodiments of the inventive concept.

FIG. 3 is a graph showing contents of atoms included in a semiconductor layer according to some embodiments of the inventive concept.

Referring to FIG. 3, atom contents according to a depth from a top surface US (or a top end) toward a bottom surface BS (or a bottom end) of the semiconductor layer SCL formed by a method according to an embodiment of the inventive concept are shown. The semiconductor layer SCL may include a metal oxide doped with nitrogen, or a metal nitroxide. The semiconductor layer SCL may be referred to as a metal oxide semiconductor layer doped with nitrogen, or a metal nitroxide semiconductor layer.

A content (or a (doping) concentration or an atomic concentration) of (doped) nitrogen (atoms) (per unit volume) in the semiconductor layer SCL formed by the method may be substantially uniform regardless of a depth and a location in the semiconductor layer SCL, as compared with a semiconductor layer formed by a typical technique.

In a typical method compared with embodiments of the inventive concept, a metal oxide semiconductor layer doped with nitrogen may be formed by supplying an $N_2$ gas while depositing a metal oxide layer by a physical vapor deposition (PVD) method, or may be formed by performing an $N_2$ plasma treatment on the metal oxide layer. However, in these cases, a content of nitrogen may be non-uniform in the semiconductor layer, and it may be difficult to control the content of nitrogen in a nanometer or angstrom scale. In another typical method compared with embodiments of the inventive concept, an ALD process may be performed by separately supplying an oxygen precursor and a nitrogen precursor, thereby forming a metal oxide semiconductor layer doped with nitrogen. However, in this method, since the oxygen precursor and the nitrogen precursor are separately supplied, the degrees of their decomposition may be varied in each process operation, and thus, the amounts of oxygen and nitrogen atoms reacting with atomic layers may be varied to cause non-uniformity of a content of nitrogen in the semiconductor layer.

However, according to embodiments of the inventive concept, the metal oxide semiconductor layer SCL doped with nitrogen may be formed by performing the ALD, PEALD, CVD or PECVD process using $N_2O$ as a precursor of oxygen and nitrogen, and thus, the semiconductor layer SCL may have a substantially uniform nitrogen content profile. In other words, in embodiments of the inventive concept, the nitrogen atoms and the oxygen atoms provided by the decomposition of $N_2O$ may be uniformly supplied to and combined with each atomic layer, and thus, the content of nitrogen may be substantially uniform regardless of location. For example, the content of nitrogen in the semiconductor layer SCL may range from about 0.1 at % to about 5.0 at %. A difference between a content of nitrogen at the top surface US of the semiconductor layer SCL and a content of nitrogen at the bottom surface BS of the semiconductor layer SCL may range from about 0.0 at % to about 0.1 at %.

A content of oxygen in the semiconductor layer SCL may range from about 54 at % to about 63 at %. The content of oxygen in the semiconductor layer SCL may also be substantially uniform regardless of location. A difference between a content of oxygen at the top surface US of the semiconductor layer SCL and a content of oxygen at the bottom surface BS of the semiconductor layer SCL may range from about 0.0 at % to about 0.1 at %.

When the semiconductor layer SCL includes one kind of a metal, the semiconductor layer SCL may be, for example, SnO:N, InO:N, GaO:N, or ZnO:N. A content of the metal in the semiconductor layer SCL may also be substantially uniform regardless of location. Here, the content of the metal may range from about 32 at % to about 45.9 at %.

When the semiconductor layer SCL includes two kinds of metals, the semiconductor layer SCL may be, for example, InSnO:N, InGaO:N, InZnO:N, ZnSnO:N, ZnGaO:N, or SnGaO:N. In FIG. 3, the ‘A’ metal may be one of In, Ga, Zn, and Sn, and the B' metal may be another one of In, Ga, Zn, and Sn. A sum of contents of the ‘A’ metal and the ‘B’ metal in the semiconductor layer SCL may range from about 32 at % to about 45.9 at %. The contents of the ‘A’ metal and the ‘B’ metal in the semiconductor layer SCL may also be substantially uniform regardless of location. A difference between a content of the ‘A’ metal at the top surface US of the semiconductor layer SCL and a content of the ‘A’ metal at the bottom surface BS of the semiconductor layer SCL may range from about 0.0 at % to about 0.1 at %. A difference between a content of the ‘B’ metal at the top surface US of the semiconductor layer SCL and a content of the ‘B’ metal at the bottom surface BS of the semiconductor layer SCL may range from about 0.0 at % to about 0.1 at %.

When the semiconductor layer SCL includes three kinds of metals (e.g., the ‘A’ metal, the ‘B’ metal and the ‘C’ metal), the semiconductor layer SCL may be, for example, InGaZnO:N, InSnGaO:N, InSnZnO:N, or SnZnGaO:N. The ‘A’ metal may be one of In, Ga, Zn, and Sn, the ‘B’ metal may be another one of In, Ga, Zn, and Sn, and the ‘C’ metal may be another one of In, Ga, Zn, and Sn. A sum of contents of the ‘A’ metal, the ‘B’ metal and the ‘C’ metal in the semiconductor layer SCL may range from about 32 at % to about 45.9 at %. The contents of the ‘A’ metal, the ‘B’ metal and the ‘C’ metal in the semiconductor layer SCL may also be substantially uniform regardless of location.

When the semiconductor layer SCL includes four kinds of metals (e.g., the ‘A’ metal, the ‘B’ metal, the ‘C’ metal and the ‘D’ metal), the semiconductor layer SCL may be, for example, InGaZnSnO:N. A sum of contents of the ‘A’ metal, the ‘B’ metal, the ‘C’ metal and the ‘D’ metal in the semiconductor layer SCL may range from about 32 at % to about 45.9 at %. The contents of the ‘A’ metal, the ‘B’ metal, the ‘C’ metal and the ‘D’ metal in the semiconductor layer SCL may also be substantially uniform regardless of location.

Next, a semiconductor device including the semiconductor layer SCL according to some embodiments of the inventive concept will be described.

Figure 4A:
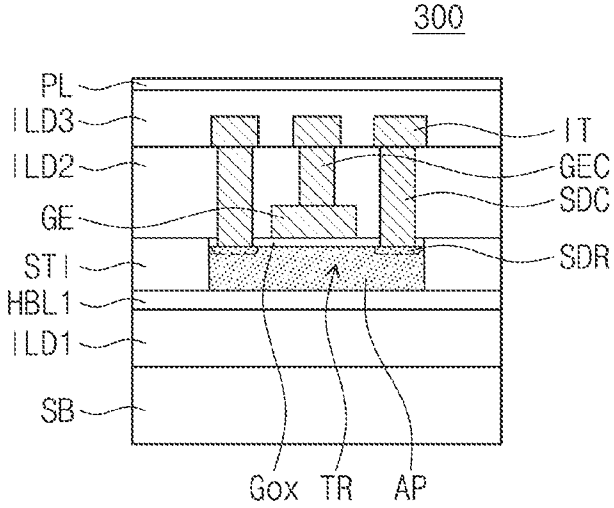
FIGS. 4A to 4C are cross-sectional views illustrating semiconductor devices according to some embodiments of the inventive concept.
Figure 4B:
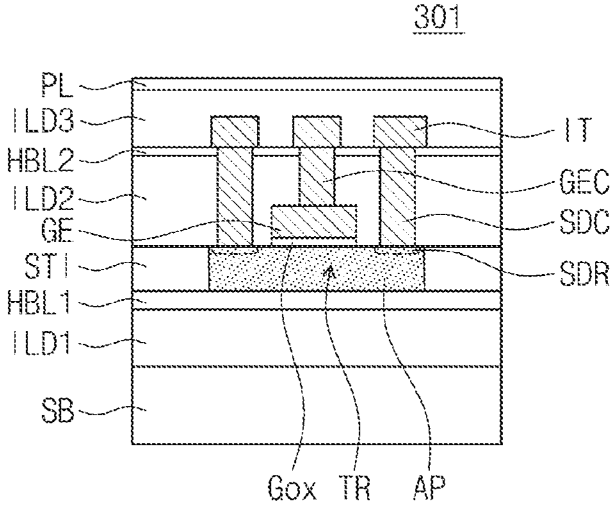
Figure 4C:
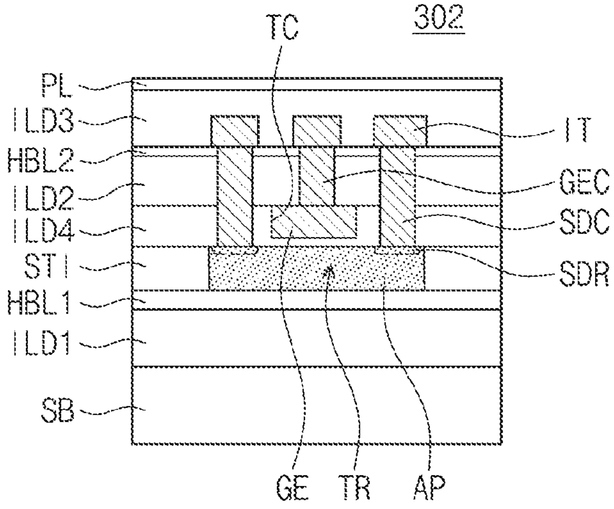

FIGS. 4A to 4C are cross-sectional views illustrating semiconductor devices according to some embodiments of the inventive concept.

Referring to FIG. 4A, a semiconductor device 300 according to some embodiments may include a substrate SB, a first interlayer insulating layer ILD1 and a first hydrogen blocking layer HBL1, which are sequentially stacked. An active pattern AP may be disposed on the first hydrogen blocking layer HBL1. A gate insulating layer Gox may be disposed on the active pattern AP. In an embodiment, the gate insulating layer Gox may cover the entirety of a top surface of the active pattern AP. A sidewall of the gate insulating layer Gox may be aligned with a sidewall of the active pattern AP. A device isolation layer STI may be disposed at sides of the active pattern AP and the gate insulating layer Gox. A gate electrode GE may be disposed on the gate insulating layer Gox. The gate electrode GE, the gate insulating layer Gox and the device isolation layer STI may be covered by a second interlayer insulating layer ILD2. Source/drain contacts SDC may penetrate the second interlayer insulating layer ILD2 and the gate insulating layer Gox at both sides of the gate electrode GE and may be in contact with the top surface of the active pattern AP. Source/drain regions SDR may be disposed in the active pattern AP under the source/drain contacts SDC. The gate electrode GE and the source/drain regions SDR may constitute a transistor TR. The active pattern AP may function as a channel layer in the transistor TR.

A gate contact GEC may penetrate the second interlayer insulating layer ILD2 so as to be in contact with the gate electrode GE. Interconnection lines IT may be disposed on the second interlayer insulating layer ILD2. The interconnection lines IT may be covered by a third interlayer insulating layer ILD3. A protective layer PL may be disposed on the third interlayer insulating layer ILD3.

Each of the first to third interlayer insulating layers ILD1 to ILD3 may be substantially the same as the interlayer insulating layer ILD1 of FIG. 1B. The first hydrogen blocking layer HBL1 may inhibit or prevent hydrogen included in the first interlayer insulating layer ILD1 from permeating into the active pattern AP. For example, each of the first hydrogen blocking layer HBL1 and the first interlayer insulating layer ILD1 may include silicon oxide containing hydrogen, and a hydrogen concentration (or content) of the first hydrogen blocking layer HBL1 may be less than a hydrogen concentration (or content) of the first interlayer insulating layer ILD1. Alternatively, the first hydrogen blocking layer HBL1 may include SiOC or $Al_2O_3$.

The active pattern AP may be the same as the semiconductor layer SCL described with reference to FIGS. 1A to 3. In other words, the active pattern AP may be a metal oxide semiconductor layer uniformly doped with nitrogen. A content of nitrogen in the active pattern AP may range from about 0.1 at % to about 5.0 at %. A difference between a content of nitrogen at the top surface of the active pattern AP and a content of nitrogen at a bottom surface of the active pattern AP may range from about 0.0 at % to about 0.1 at %. The active pattern AP may also include a metal and oxygen. Contents of the metal and oxygen in the active pattern AP may be substantially uniform regardless of location. For example, the active pattern AP may include SnO:N, InO:N, GaO:N, ZnO:N, InSnO:N, InGaO:N, InZnO:N, ZnSnO:N, ZnGaO:N, SnGaO:N, InGaZnO:N, InSnGaO:N, InSnZnO:N, SnZnGaO:N, or InGaZnSnO:N.

If the first hydrogen blocking layer HBL1 does not exist, hydrogen included in the first interlayer insulating layer ILD1 may permeate into the active pattern AP so as to be combined with atoms of the active pattern AP, and thus, the active pattern AP may become a conductor, not a semiconductor layer. In this case, the transistor TR may not function as a transistor.

The gate insulating layer Gox may include, for example, aluminum oxide, and thus, may perform a function of blocking hydrogen. In an embodiment, a gate capping pattern and a gate spacer are not utilized, and thus, a top surface (e.g., a portion of the top surface not contacting the gate contact GEC) and sidewalls of the gate electrode GE may be in contact (e.g., direct contact) with the second interlayer insulating layer ILD2. A gate capping pattern and the gate spacer may primarily include silicon nitride and may be formed, for example, by supplying a silane gas ($SiH_4$ and/or $Si_2H_6$) as a source gas of silicon. During formation of a gate capping pattern and a gate spacer, hydrogen included in the source gas of silicon may permeate into the active pattern AP to adversely affect the active pattern AP. However, in embodiments of the inventive concept, since the top surface and the sidewalls of the gate electrode GE are not covered by a gate capping pattern and a gate spacer, this phenomenon may be prevented.

The source/drain regions SDR may include (atoms of) at least one of, for example, hydrogen, fluorine, or argon. The protective layer PL may include, for example, silicon nitride. The device isolation layer STI may have a single-layered or multi-layered structure including at least one of, for example, silicon oxide, silicon nitride, or silicon oxynitride. A top surface of the device isolation layer STI may be substantially coplanar with a top surface of the gate insulating layer Gox.

Since the active pattern AP has a substantially uniform content of nitrogen regardless of location, light may have no effect or a limited effect on a threshold voltage of the transistor TR included in the semiconductor device 300 of FIG. 4A. For example, the change in threshold voltage of the transistor TR by light may be about 0.1 V or less. In other words, an NBIS-NBS of the transistor TR may be about 0.1 V or less. 'NBIS' is an abbreviation of negative bias illumination stress, and 'NBS' is an abbreviation of negative bias stress. When the semiconductor device having the transistor TR is applied to a driving transistor of an image sensor, signal noise caused by light may be reduced to increase reliability (e.g., optical reliability) of the image sensor.

Referring to FIG. 4B, in a semiconductor device 301 according to some embodiments, a sidewall of the gate insulating layer Gox may be substantially aligned with a sidewall of the gate electrode GE, and a top surface of the active pattern AP may be substantially coplanar with a top surface of the device isolation layer STI. Other structures and components may be the same/similar as corresponding structures and components of FIG. 4A.

Referring to FIG. 4C, in a semiconductor device 302 according to some embodiments, a fourth interlayer insulating layer ILD4 may be disposed between the second interlayer insulating layer ILD2 and the device isolation layer STI of the structure of FIG. 4B. A trench TC may be formed in the fourth interlayer insulating layer ILD4. The gate electrode GE may be disposed in the trench TC. A bottom surface of the trench TC may be spaced apart from the active pattern AP. A portion of the fourth interlayer insulating layer ILD4 may be disposed between the gate electrode GE and the active pattern AP to function as a gate insulating layer Gox. In other words, the gate insulating layer Gox and the fourth interlayer insulating layer ILD4 may be formed in one body. A top surface of the fourth interlayer insulating layer IDL4 may be substantially coplanar with a top surface of the gate electrode GE. A second hydrogen blocking layer HBL2 may be disposed between the second interlayer insulating layer ILD2 and the third interlayer insulating layer ILD3. The second hydrogen blocking layer HBL2 may include the same material as the first hydrogen blocking layer HBL1. Other structures and components may be the same/similar as described with reference to FIG. 4B.

Figure 5:
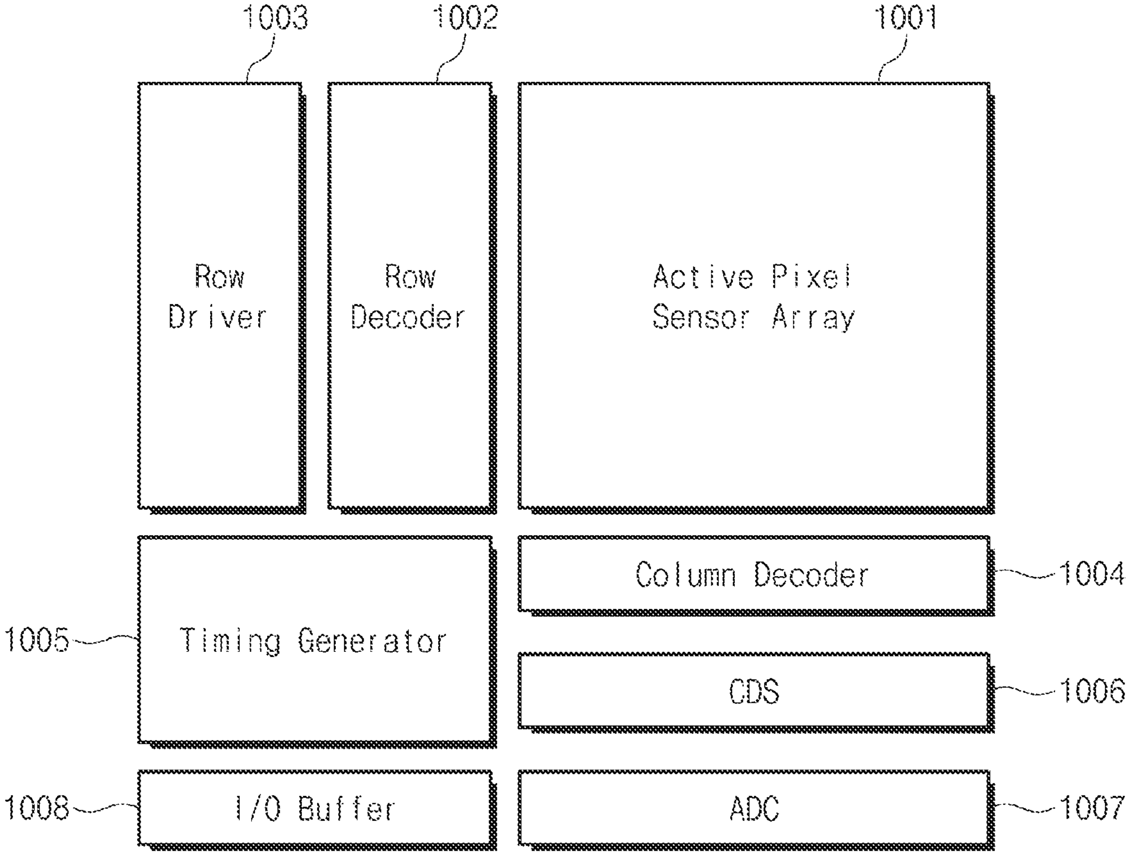
FIG. 5 is a block diagram illustrating an image sensor according to some embodiments of the inventive concept.

FIG. 5 is a block diagram illustrating an image sensor according to some embodiments of the inventive concept.

Referring to FIG. 5, an image sensor may include an active pixel sensor array 1001, a row decoder 1002, a row driver 1003, a column decoder 1004, a timing generator 1005, a correlated double sampler (CDS) 1006, an analog-to-digital converter (ADC) 1007, and an input/output (I/O) buffer 1008.

The active pixel sensor array 1001 may include a plurality of unit pixels two-dimensionally arranged and may convert optical signals into electrical signals. The active pixel sensor array 1001 may be driven by a plurality of driving signals (e.g., a pixel selection signal, a reset signal, and a charge transfer signal) provided from the row driver 1003. In addition, the converted electrical signals may be provided to the correlated double sampler 1006.

The row driver 1003 may provide a plurality of driving signals for driving a plurality of unit pixels to the active pixel sensor array 1001 in response to signals decoded in the row decoder 1002. When the unit pixels are arranged in a matrix form, the driving signals may be provided in the unit of a row of the matrix.

The timing generator 1005 may provide timing signals and control signals to the row decoder 1002 and the column decoder 1004.

The correlated double sampler 1006 may receive electrical signals generated from the active pixel sensor array 1001 and may hold and sample the received electrical signals. The correlated double sampler 1006 may doubly sample a specific noise level and a signal level of the electrical signal to output a difference level corresponding to a difference between the noise level and the signal level.

The analog-to-digital converter 1007 may convert an analog signal, which corresponds to the difference level outputted from the correlated double sampler 1006, into a digital signal, and may output the digital signal.

The I/O buffer 1008 may latch the digital signals, and the latched signals may be sequentially output to an image signal processing unit in response to signals decoded in the column decoder 1004.

Figure 6:
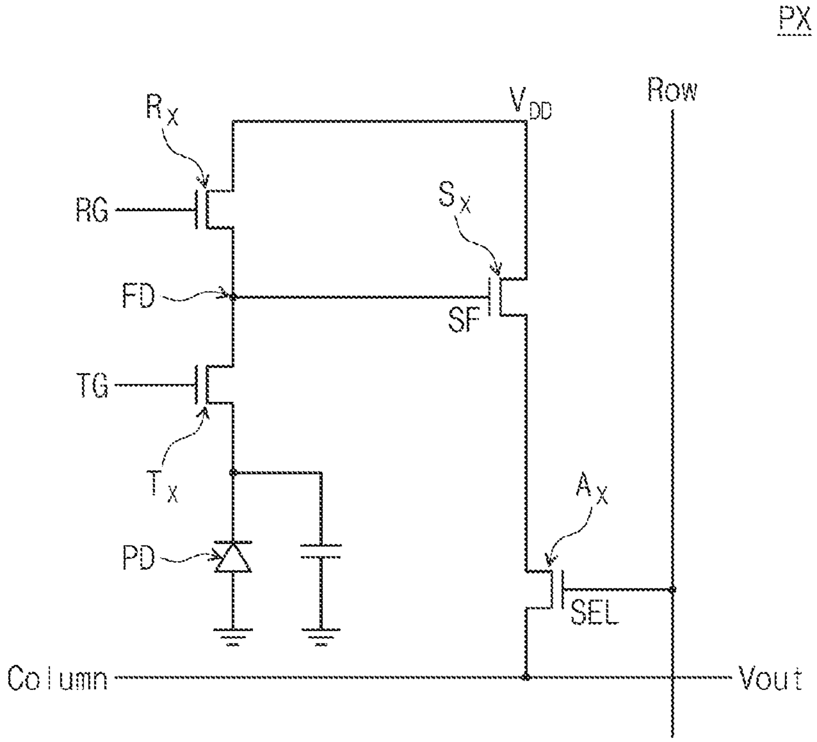
FIG. 6 is a circuit diagram illustrating an active pixel sensor array of an image sensor according to some embodiments of the inventive concept.

FIG. 6 is a circuit diagram illustrating an active pixel sensor array of an image sensor according to some embodiments of the inventive concept.

Referring to FIGS. 5 and 6, the active pixel sensor array 1001 may include a plurality of pixels (or unit pixels) PX. The pixels PX may be arranged in a matrix form. Each of the pixels PX may include a transfer transistor Tx and logic transistors Rx, Sx and Ax. Here, the logic transistors may include a reset transistor Rx, a selection transistor Ax, and a source follower transistor Sx.

The transfer transistor Tx, the source follower transistor Sx, the reset transistor Rx and the selection transistor Ax may include a transfer gate TG, a source follower gate SF, a reset gate RG and a selection gate SEL, respectively. A photoelectric conversion portion may be provided in a photoelectric conversion region PD connected to the transfer transistor Tx. The photoelectric conversion portion may be a photodiode including an N-type dopant region and a P-type dopant region. A drain of the transfer transistor Tx may be a floating diffusion region FD. The floating diffusion region FD may also correspond to a source of the reset transistor Rx. The floating diffusion region FD may be electrically connected to the source follower gate SF of the source follower transistor Sx. The source follower transistor Sx may be connected to the selection transistor Ax. The reset transistor Rx, the source follower transistor Sx and the selection transistor Ax may be shared by neighboring pixels, and thus, an integration density of the image sensor may be increased.

An operation of the image sensor will be described hereinafter with reference to FIG. 6.

First, a power voltage $V_{DD}$ may be applied to drains of the reset transistor Rx and the source follower transistor Sx in a dark state, thereby discharging charges remaining in the floating diffusion region FD. Thereafter, the reset transistor Rx may be turned off, and external light may be incident to the photoelectric conversion region PD to generate electron-hole pairs in the photoelectric conversion region PD. Holes may move to the P-type dopant region of the photoelectric conversion region PD, and electrons may move into and be accumulated in the N-type dopant region of the photoelectric conversion region PD. When the transfer transistor Tx is turned on, these charges may be transferred into and accumulated in the floating diffusion region FD. A gate bias of the source follower transistor Sx may be changed in proportion to the amount of the charges accumulated in the floating diffusion region FD, thereby causing a change in potential of a source of the source follower transistor Sx. At this time, the selection transistor Ax may be turned on, and thus, a signal generated by the charges may be sensed through a column line.

Figure 7:
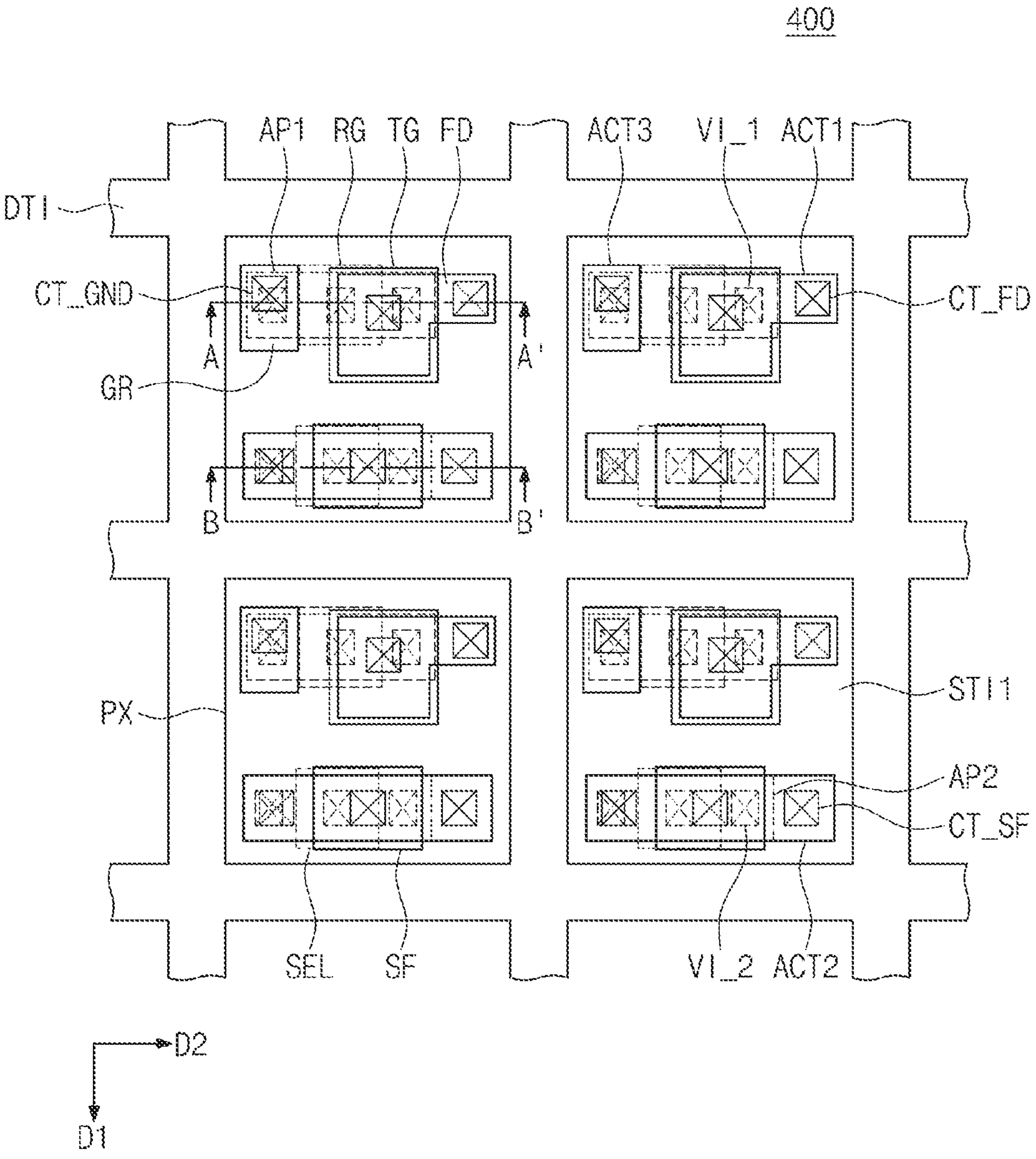
FIG. 7 is a plan view illustrating pixels of an image sensor according to some embodiments of the inventive concept.
Figure 8:
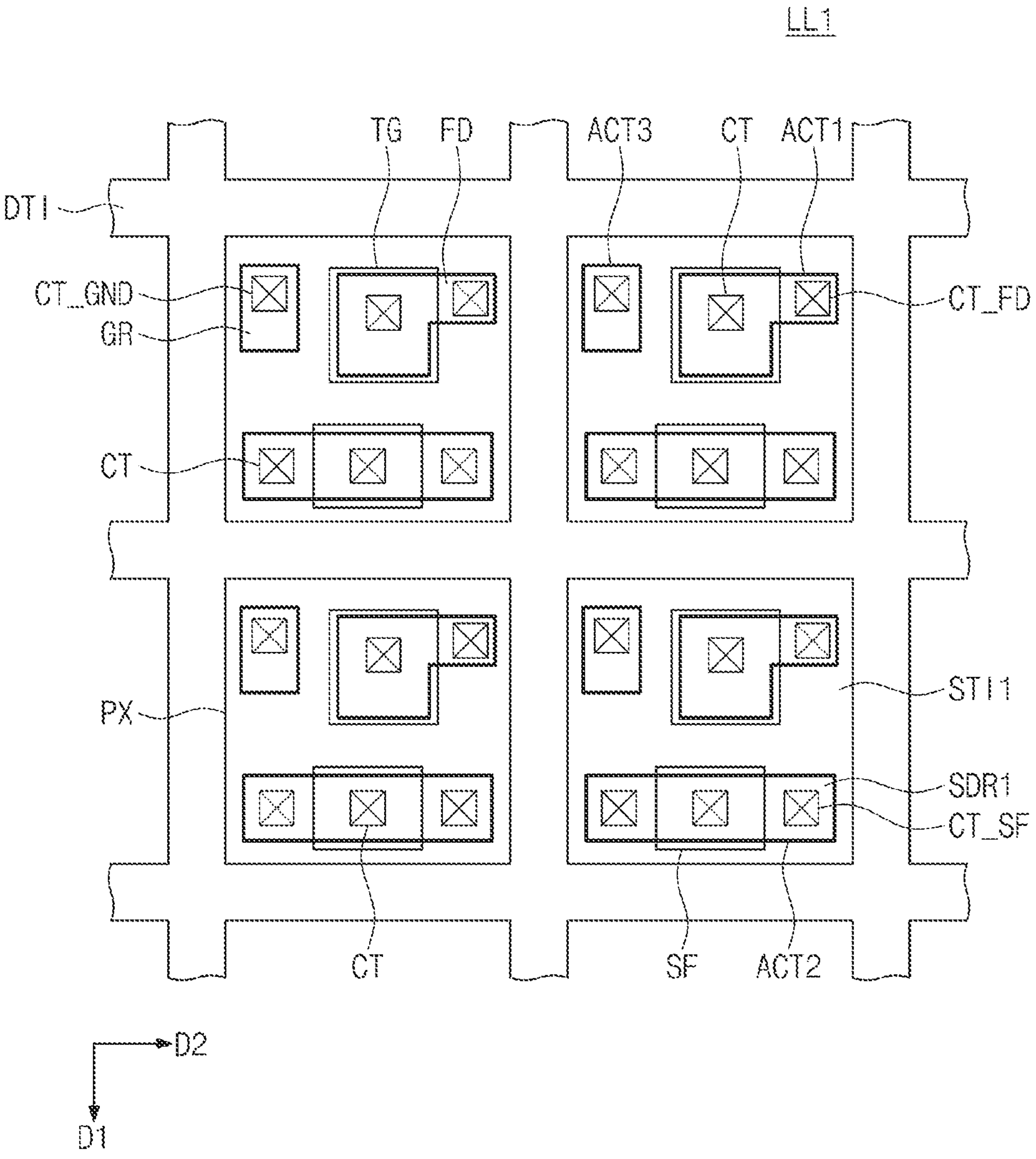
FIG. 8 is a plan view illustrating a layer of an image sensor according to some embodiments of the inventive concept.
Figure 9:
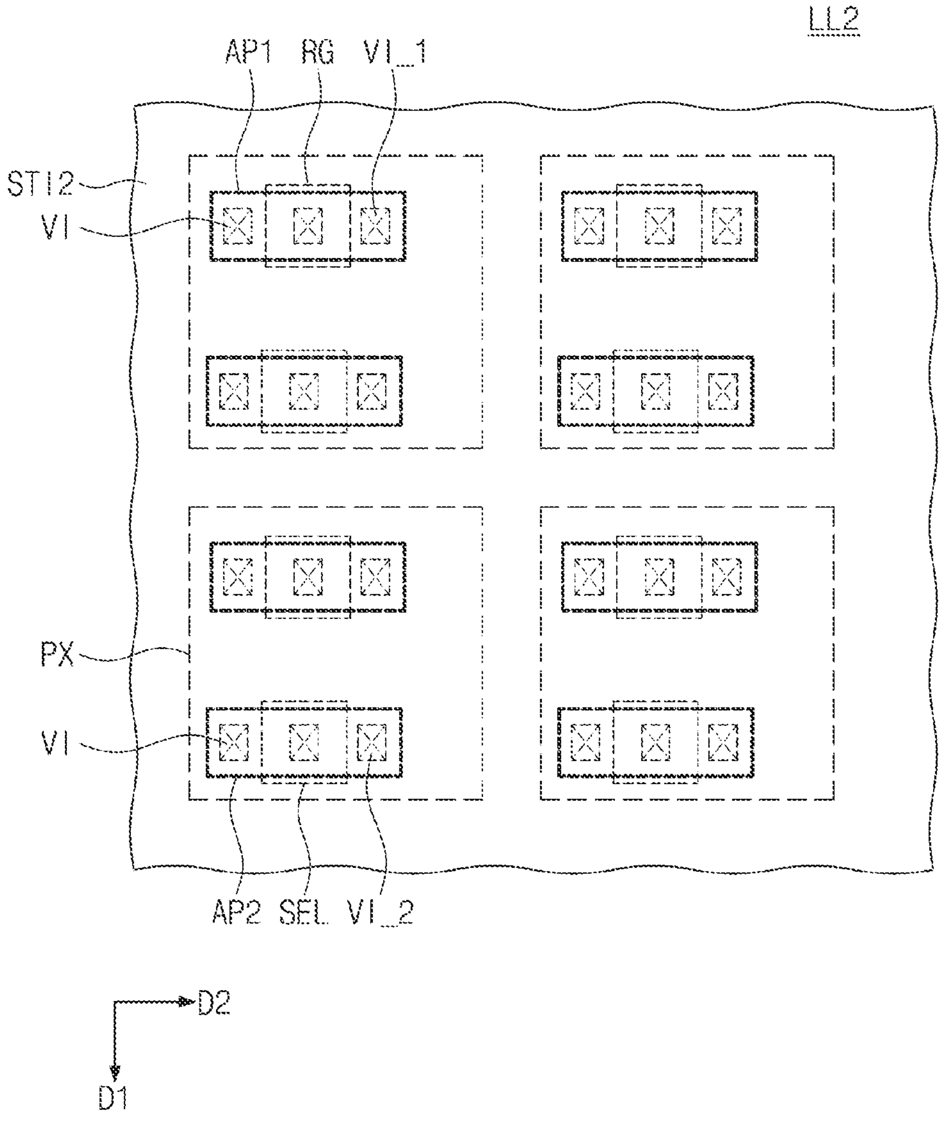
FIG. 9 is a plan view illustrating a layer of an image sensor according to some embodiments of the inventive concept.
Figure 10A:
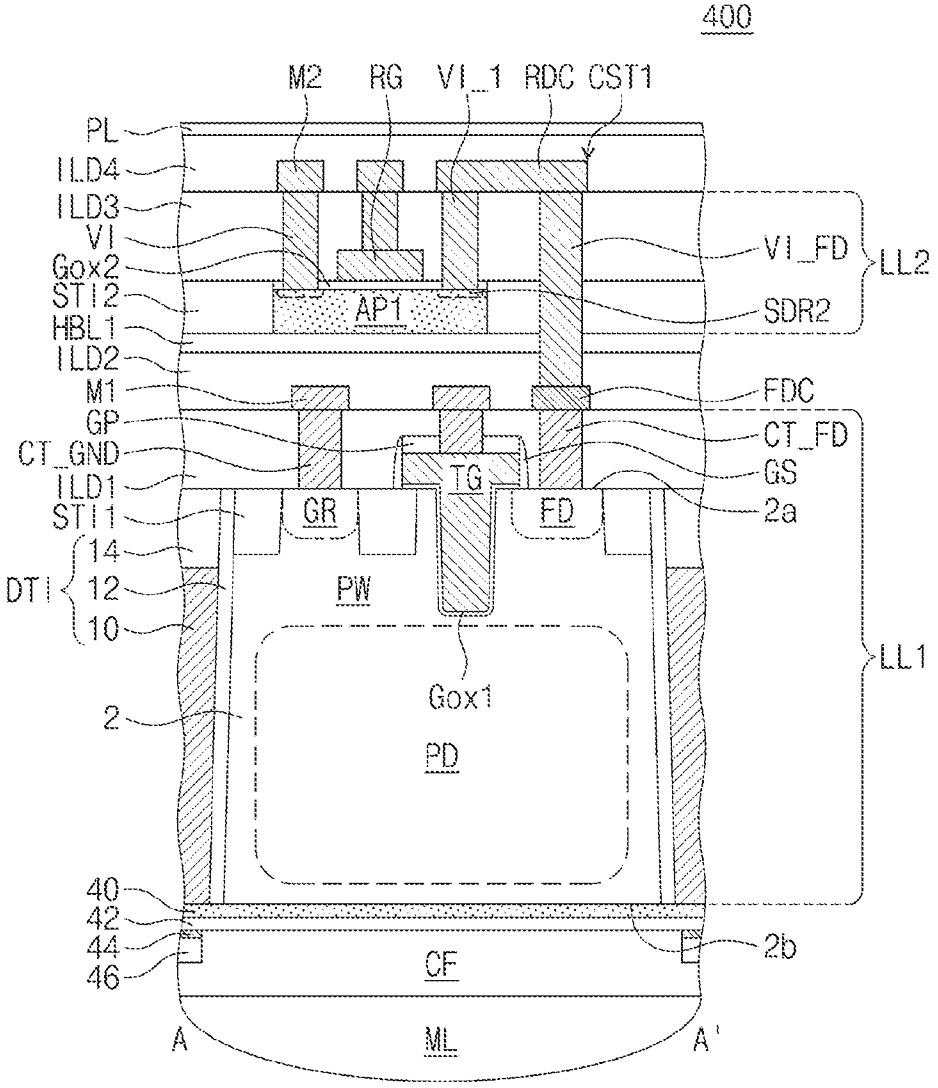
FIG. 10A is a cross-sectional view taken along line A-A' of FIG. 7 according to some embodiments of the inventive concept.
Figure 10B:
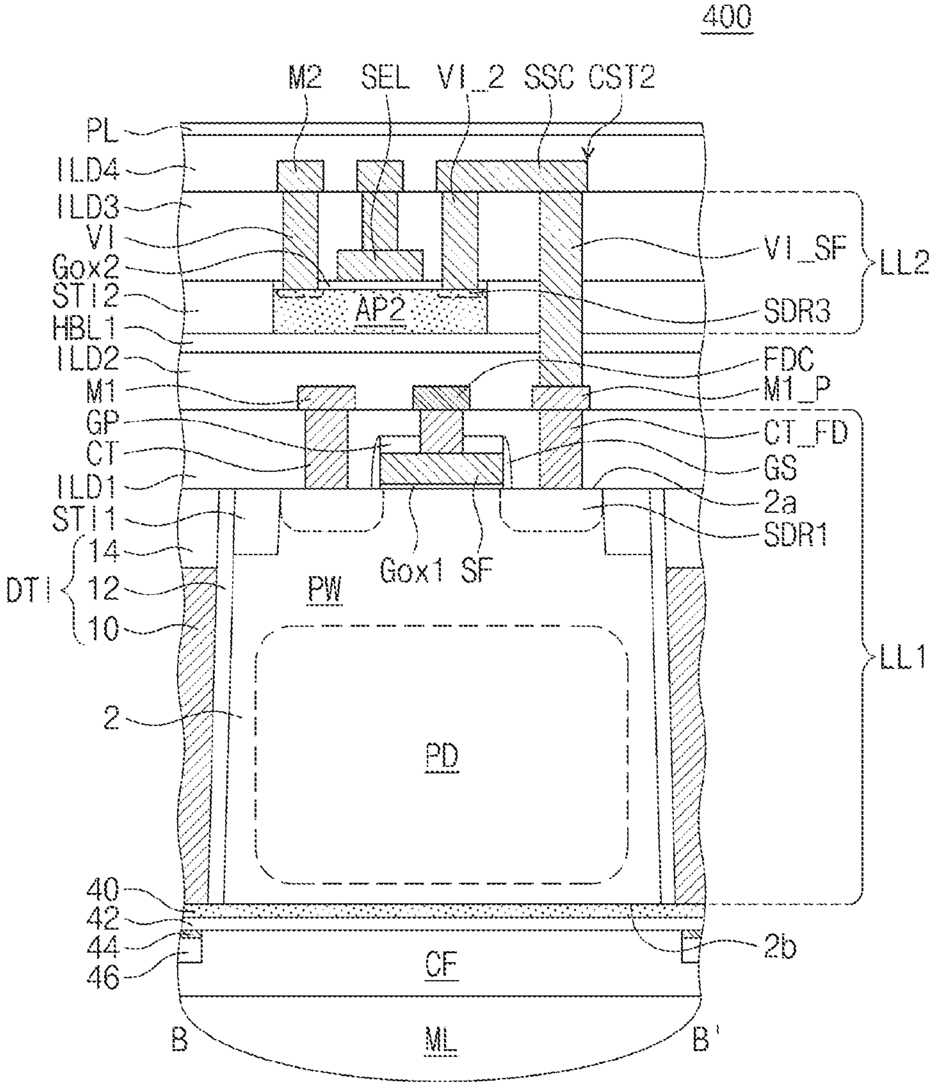
FIG. 10B is a cross-sectional view taken along line B-B' of FIG. 7 according to some embodiments of the inventive concept.

FIG. 7 is a plan view illustrating pixels of an image sensor according to some embodiments of the inventive concept. FIG. 8 is a plan view illustrating a layer LL1 of an image sensor according to some embodiments of the inventive concept. FIG. 9 is a plan view illustrating a layer LL2 of an image sensor according to some embodiments of the inventive concept. FIG. 7 illustrates the drawings in FIGS. 8 and 9 overlapping each other. FIG. 10A is a cross-sectional view taken along line A-A' of FIG. 7 according to some embodiments of the inventive concept. FIG. 10B is a cross-sectional view taken along line B-B' of FIG. 7 according to some embodiments of the inventive concept.

Referring to FIGS. 7 to 9, 10A and 10B, a substrate 2 may be provided in an image sensor 400 according to some embodiments of the inventive concept. The substrate 2 may include a plurality of pixels PX two-dimensionally arranged in a first direction D1 and a second direction D2. The first direction D1 and the second direction D2 may intersect each other. A single pixel PX is illustrated as an example in FIGS. 10A and 10B. The substrate 2 may include a first surface 2*a* and a second surface 2*b* which are opposite to each other. Light may be incident onto the second surface 2*b* of the substrate 2. The substrate 2 may be, for example, a single-crystalline wafer or epitaxial layer including silicon and/or germanium, or a silicon-on-insulator (SOI) substrate. The substrate 2 may be doped with dopants having a first conductivity type. The first conductivity type may be, for example, a P-type. The dopants having the first conductivity type may be, for example, boron.

A pixel isolation portion DTI isolating and defining the pixels PX from each other may be disposed in the substrate 2. The pixel isolation portion DTI may have a mesh or grid shape when viewed in a plan view. The pixel isolation portion DTI may include an isolation conductive pattern 10 spaced apart from the substrate 2. The isolation conductive pattern 10 may include a conductive material having a refractive index different from that of the substrate 2. For example, the isolation conductive pattern 10 may include poly-silicon doped with dopants, or a metal. The pixel isolation portion DTI may further include an isolation insulating pattern 12 disposed between the isolation conductive pattern 10 and the substrate 2. The isolation insulating pattern 12 may include an insulating material having a refractive index different from that of the substrate 2. For example, the isolation insulating pattern 12 may include silicon oxide. The pixel isolation portion DTI may penetrate the substrate 2. The pixel isolation portion DTI may further include a capping insulating pattern 14 provided on the isolation conductive pattern 10. For example, the capping insulating pattern 14 may include at least one of silicon oxide, silicon oxynitride, or silicon nitride.

A negative bias voltage may be applied to the isolation conductive pattern 10. The isolation conductive pattern 10 may function as a common bias line. Thus, holes which may exist on a surface of the substrate 2 being in contact with the pixel isolation portion DTI may be captured to reduce or minimize a dark current.

Three active regions ACT1 to ACT3 may be disposed at the first surface 2*a* of the substrate 2 in each of the pixels PX. The active regions ACT1 to ACT3 may be defined by a first device isolation layer STI1 disposed adjacent to the first surface 2*a* in the substrate 2. The first device isolation layer STI1 may be formed by a shallow trench isolation (STI) method. The first device isolation layer STI1 may be formed of a single layer or multi-layer including at least one of, for example, a silicon oxide layer, a silicon nitride layer, or a silicon oxynitride layer.

A first active region ACT1 may be an active region for a transfer transistor. A transfer gate TG may be disposed on the first active region ACT1. The transfer gate TG may be a vertical type gate as illustrated in FIG. 10A. For example, a portion of the transfer gate TG may be disposed on the first surface 2*a* of the substrate 2, and another portion of the transfer gate TG may protrude into the substrate 2. Alternatively, in some embodiments, the transfer gate TG may be a planar type gate without a portion protruding into the substrate 2. A first gate insulating layer Gox1 may be disposed between the transfer gate TG and the substrate 2. The first gate insulating layer Gox1 may include a single layer or multi-layer including at least one of, for example, a silicon oxide layer, a metal oxide layer, a silicon nitride layer, or a silicon oxynitride layer.

A floating diffusion region FD may be disposed in the first active region ACT1 at a side of the transfer gate TG. The floating diffusion region FD may be doped with dopants having a second conductivity type opposite to the first conductivity type of the substrate 2. For example, the floating diffusion region FD may be doped with N-type dopants such as, for example, phosphorus or arsenic.

A photoelectric conversion portion PD may be disposed in the substrate 2 of the pixel PX. A well region PW may be disposed between the photoelectric conversion portion PD and the first surface 2*a*. For example, the well region PW may be doped with dopants having the first conductivity type, like the substrate 2. A concentration of the dopants having the first conductivity type in the well region PW may be equal to or greater than a concentration of the dopants in the substrate 2. The photoelectric conversion portion PD may be doped with dopants having the second conductivity type opposite to the first conductivity type. For example, the photoelectric conversion portion PD may be doped with N-type dopants such as, for example, phosphorus or arsenic. The N-type dopant region of the photoelectric conversion portion PD may form a PN junction with the P-type dopant region of the substrate 2 and/or the well region PW to form a photodiode, and electron-hole pairs may be generated by the PN junction when light is incident.

A second active region ACT2 may have a bar shape extending in the second direction D2 when viewed in a plan view. A source follower gate SF may be disposed on the second active region ACT2. The first gate insulating layer Gox1 may also be disposed between the source follower gate SF and the substrate 2. First source/drain regions SDR1 may be disposed in the second active region ACT2 at both sides of the source follower gate SF. The first source/drain regions SDR1 may be doped with dopants having the second conductivity type opposite to the first conductivity type. The source follower gate SF and the first source/drain regions SDR1 may constitute the source follower transistor Sx described with reference to FIG. 6.

A gate capping pattern GP may cover each of top surfaces of the transfer gate TG and the source follower gate SF, and a gate spacer GS may cover each of sidewalls of the transfer gate TG and the source follower gate SF. Each of the gate capping pattern GP and the gate spacer GS may have a single-layered or multi-layered structure including at least one of, for example, silicon nitride, silicon oxide, or silicon oxynitride.

A ground region GR may be formed in the substrate 2 of a third active region ACTS and may be adjacent to the first surface 2*a*. The ground region GR may be doped with dopants having the first conductivity type at a concentration higher than that of the substrate 2.

A first interlayer insulating layer ILD1 may be disposed on the first surface 2*a* to cover the transfer gate TG and the source follower gate SF. Contacts CT may penetrate the first interlayer insulating layer ILD1 so as to be in contact with the gates TG and SF and the dopant regions FD, GR and SDR1 disposed at sides thereof. A contact, connected to the floating diffusion region FD, of the contacts CT may be referred to as a FD contact CT_FD. A contact, connected to the ground region GR, of the contacts CT may be referred to as a GND contact CT_GND. A ground voltage or a negative bias voltage may be applied to the ground region GR through the GND contact CT_GND. A contact, connected to one of the first source/drain regions SDR1, of the contacts CT may be referred to as a SF contact CT_SF. A layer including the substrate 2 and the first interlayer insulating layer ILD1 may be referred to as a layer LL1.

First interconnection lines M1, a FD connection line FDC and a first interconnection pad M1_P may be disposed on the first interlayer insulating layer ILD1. The FD connection line FDC may be connected to the FD contact CT_FD and may be electrically connected to the source follower gate SF. The first interconnection lines M1, the FD connection line FDC and the first interconnection pad M1_P may be covered by a second interlayer insulating layer ILD2. A first hydrogen blocking layer HBL1 may be disposed on the second interlayer insulating layer ILD2.

First and second active patterns AP1 and AP2 spaced apart from each other and a second device isolation layer STI2 may be disposed on the first hydrogen blocking layer HBL1. Second gate insulating layers Gox2 may cover the first and second active patterns AP1 and AP2, respectively. A reset gate RG may be disposed on the first active pattern APE A selection gate SEL may be disposed on the second active pattern AP2. For example, the second gate insulating layers Gox2 may include $Al_2O_3$, and thus, may perform a function of blocking hydrogen.

The first and second active patterns AP1 and AP2 and the second device isolation layer STI2 may be covered by a third interlayer insulating layer ILD3. Vias VI may penetrate the third interlayer insulating layer ILD3. Second interconnection lines M2, a RD connection line RDC and a SS connection line SSC may be disposed on the third interlayer insulating layer ILD3. A fourth interlayer insulating layer ILD4 may cover the second interconnection lines M2, the RD connection line RDC and the SS connection line SSC. A protective layer PL may be disposed on the fourth interlayer insulating layer ILD4. A layer including the first and second active patterns AP1 and AP2, the second device isolation layer STI2 and the third interlayer insulating layer ILD3 may be referred to as a layer LL2.

For example, each of the first to fourth interlayer insulating layers ILD1 to ILD4 may be formed of a single layer or multi-layer including at least one of silicon oxide, silicon nitride, silicon oxynitride, SiOCH, TEOS, or a porous insulating material.

The first hydrogen blocking layer HBL1 may inhibit or prevent hydrogen included in the first and second interlayer insulating layers ILD1 and ILD2 from permeating into the first and second active patterns AP1 and AP2. For example, each of the first hydrogen blocking layer HBL1 and the first and second interlayer insulating layers ILD1 and ILD2 may include silicon oxide containing hydrogen, and a hydrogen concentration (or content) of the first hydrogen blocking layer HBL1 may be less than hydrogen concentrations (or contents) of the first and second interlayer insulating layers ILD1 and ILD2. Alternatively, the first hydrogen blocking layer HBL1 may include, for example, SiOC or $Al_2O_3$.

Each of the first and second active patterns AP1 and AP2 may be the same as the semiconductor layer SCL described with reference to FIGS. 1A to 3. In other words, each of the first and second active patterns AP1 and AP2 may be a metal oxide semiconductor layer uniformly doped with nitrogen. A content of nitrogen in each of the first and second active patterns AP1 and AP2 may range from about 0.1 at % to about 5.0 at %. A difference between a content of nitrogen at a top surface of each of the first and second active patterns AP1 and AP2 and a content of nitrogen at a bottom surface of each of the first and second active patterns AP1 and AP2 may range from about 0.0 at % to about 0.1 at %. The first and second active patterns AP1 and AP2 may also include a metal and oxygen. Contents of the metal and oxygen in each of the first and second active patterns AP1 and AP2 may be substantially uniform regardless of location. For example, each of the first and second active patterns AP1 and AP2 may include SnO:N, InO:N, GaO:N, ZnO:N, InSnO:N, InGaO:N, InZnO:N, ZnSnO:N, ZnGaO:N, SnGaO:N, InGaZnO:N, InSnGaO:N, InSnZnO:N, SnZnGaO:N, or InGaZnSnO:N.

Some of the vias VI may penetrate the third interlayer insulating layer ILD3 so as to be in contact with the top surface of the first active pattern AP1 at both sides of the reset gate RG. Second source/drain regions SDR2 may be disposed in the first active pattern AP1 under the some of the vias VI. Other ones of the vias VI may penetrate the third interlayer insulating layer ILD3 so as to be in contact with the top surface of the second active pattern AP2 at both sides of the selection gate SEL. Third source/drain regions SDR3 may be disposed in the second active pattern AP2 under the other ones of the vias VI. The second and third source/drain regions SDR2 and SDR3 may be doped with dopants different from the dopants of the first source/drain regions SDR1. For example, the second and third source/drain regions SDR2 and SDR3 may be doped with atoms of at least one of hydrogen, fluorine, or argon.

The second source/drain region SDR2 at one side of the reset gate RG may be electrically connected to the floating diffusion region FD through a first interconnection structure CST1. The first interconnection structure CST1 may include a first via VI_1, the RD connection line RDC, a FD via VI_FD, the FD connection line FDC, and the FD contact CT_FD.

The third source/drain region SDR3 at one side of the selection gate SEL may be electrically connected to the first source/drain region SDR1 at one side of the source follower gate SF through a second interconnection structure CST2. The second interconnection structure CST2 may include a second via VI_2, the SS connection line SSC, a SF via VI_SF, the first interconnection pad M1_P, and the SF contact CT_SF.

The RD connection line RDC may be referred to as a floating diffusion region-reset transistor connection line. The SS connection line SSC may be referred to as a source follower transistor-selection transistor connection line. The FD via VI_FD may be referred to as a floating diffusion region connection via. The SF via VI_SF may be referred to as a first source/drain region connection via. Each of the FD via VI_FD and the SF via VI_SF may penetrate the third interlayer insulating layer ILD3, the second device isolation layer STI2, the first hydrogen blocking layer HBL1, and the second interlayer insulating layer ILD2.

A fixed charge layer 40 may be disposed on the second surface 2*b*. The fixed charge layer 40 may be in contact with the second surface 2*b*. The fixed charge layer 40 may include a metal oxide layer containing insufficient oxygen in terms of a stoichiometric ratio, or a metal fluoride layer containing insufficient fluorine in terms of a stoichiometric ratio. Thus, the fixed charge layer 40 may have negative fixed charges. For example, the fixed charge layer 40 may be formed of a metal oxide layer or metal fluoride layer including at least one metal among hafnium (HD, zirconium (Zr), aluminum (Al), tantalum (Ta), titanium (Ti), yttrium (Y), and a lanthanoid. Holes may be accumulated in the vicinity of the fixed charge layer 40. Thus, a dark current and a white spot may be effectively reduced. For example, the fixed charge layer 40 may include at least one of an aluminum oxide layer or a hafnium oxide layer.

An anti-reflection layer 42 may be disposed on the fixed charge layer 40. For example, the anti-reflection layer 42 may include silicon nitride. A light blocking pattern 44 and a low-refractive index pattern 46 may be sequentially stacked on the anti-reflection layer 42. The light blocking pattern 44 and the low-refractive index pattern 46 may have mesh or grid shapes in a plan view and may overlap the pixel isolation portion DTI. The light blocking pattern 44 and the low-refractive index pattern 46 may expose the anti-reflection layer 42 provided on the photoelectric conversion portion PD. A color filter CF may be disposed on the anti-reflection layer 42. A micro lens ML may be disposed on the color filter CF.

The light blocking pattern 44 may include a material that does not transmit light such as, for example, titanium. A sidewall of the low-refractive index pattern 46 may be substantially aligned with a sidewall of the light blocking pattern 44. The light blocking pattern 44 and the low-refractive index pattern 46 may prevent or reduce crosstalk between the pixels PX adjacent to each other. The low-refractive index pattern 46 may include an organic material. The low-refractive index pattern 46 may have a refractive index lower than that of the color filter CF. For example, the low-refractive index pattern 46 may have a refractive index of about 1.3 or less.

Colors of the color filters CF of some pixels PX may be different from each other. The color filter CF may include a photoresist material to which a dye or pigment is added. For example, the color filter CF may have one of a blue color, a red color, and a green color. Alternatively, the color filter CF may have one of a cyan color, a yellow color, and a magenta color. The color filter CF may be provided in a plurality, and the plurality of color filters CF may be two-dimensionally arranged in the first direction D1 and the second direction D2. The color filters CF may be arranged in the form of a Bayer pattern, a 2×2 tetra pattern, or a 3×3 Nona pattern. Other features may be the same/similar as described with reference to FIG. 4A.

The active patterns AP1 and AP2 used as channel layers of the reset and selection transistors Rx and Ax of the image sensor 400 according to embodiments of the inventive concept may have substantially uniform content of nitrogen regardless of location, and thus, light may have no effect or little effect on the threshold voltages of the reset and selection transistors Rx and Ax. For example, the changes in threshold voltage of the reset transistor Rx and the selection transistor Ax by light may be about 0.1 V or less. In other words, an NBIS-NBS of each of the reset transistor Rx and the selection transistor Ax may be about 0.1 V or less. Thus, signal noise caused by light in the image sensor 400 may be reduced to increase reliability (e.g., optical reliability) of the image sensor 400.

The reset gate RG may overlap the transfer gate TG. In other words, the reset transistor Rx may be disposed on the transfer transistor Tx due to the first active pattern APE The selection gate SEL may overlap the source follower gate SF. In other words, the selection transistor Ax may be disposed on the source follower transistor Sx due to the second active pattern AP2. In addition, all of the transfer transistor Tx, the reset transistor Rx, the source follower transistor Sx and the selection transistor Ax may be disposed in each of the pixels PX when viewed in a plan view. Thus, an integration density of the image sensor 400 may be improved.

FIGS. 11A, 12A, 13A, 14A and 15A are cross-sectional views illustrating a method of manufacturing an image sensor of FIG. 10A according to some embodiments of the inventive concept. FIGS. 11B, 12B, 13B, 14B and 15B are cross-sectional views illustrating a method of manufacturing an image sensor of FIG. 10B according to some embodiments of the inventive concept.

Figure 11A:
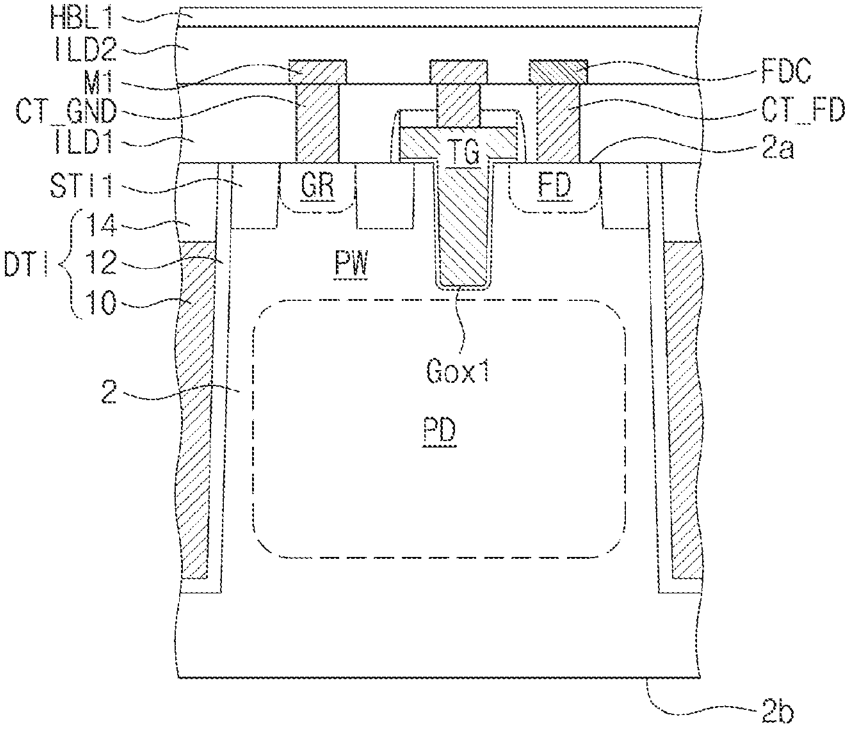
FIGS. 11A, 12A, 13A, 14A and 15A are cross-sectional views illustrating a method of manufacturing an image sensor of FIG. 10A according to some embodiments of the inventive concept.
Figure 11B:
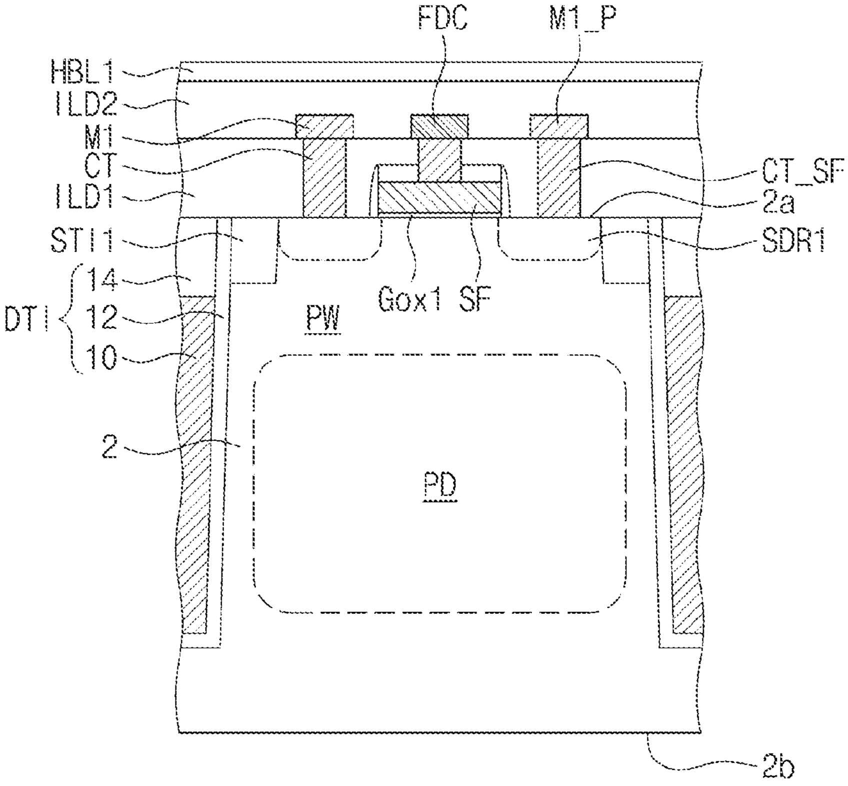
FIGS. 11B, 12B, 13B, 14B and 15B are cross-sectional views illustrating a method of manufacturing an image sensor of FIG. 10B according to some embodiments of the inventive concept.

Referring to FIGS. 11A and 11B, a photoelectric conversion portion PD, a first device isolation layer STI1 a pixel isolation portion DTI, a first gate insulating layer Gox1, a transfer gate TG, a source follower gate SF, a ground region GR and a floating diffusion region FD may be formed in/on a substrate 2. A bottom end of the pixel isolation portion DTI may be spaced apart from a second surface 2*b* of the substrate 2. Subsequently, a first interlayer insulating layer ILD1, contacts CT, CT_GND, CT_FD and CT_SF, first interconnection lines M1, a FD connection line FDC, a first interconnection pad M1_P and a second interlayer insulating layer ILD2 may be formed. A first hydrogen blocking layer HBL1 may be formed on the second interlayer insulating layer ILD2. The first hydrogen blocking layer HBL1 may be formed by, for example, an ALD process or a CVD process.

Figure 12A:
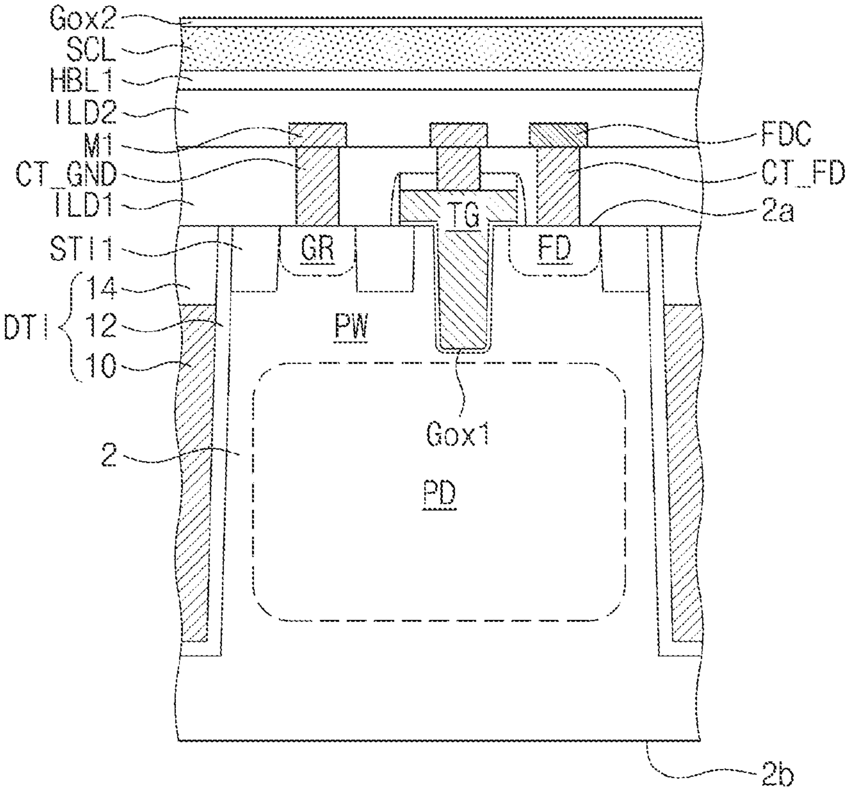
Figure 12B:
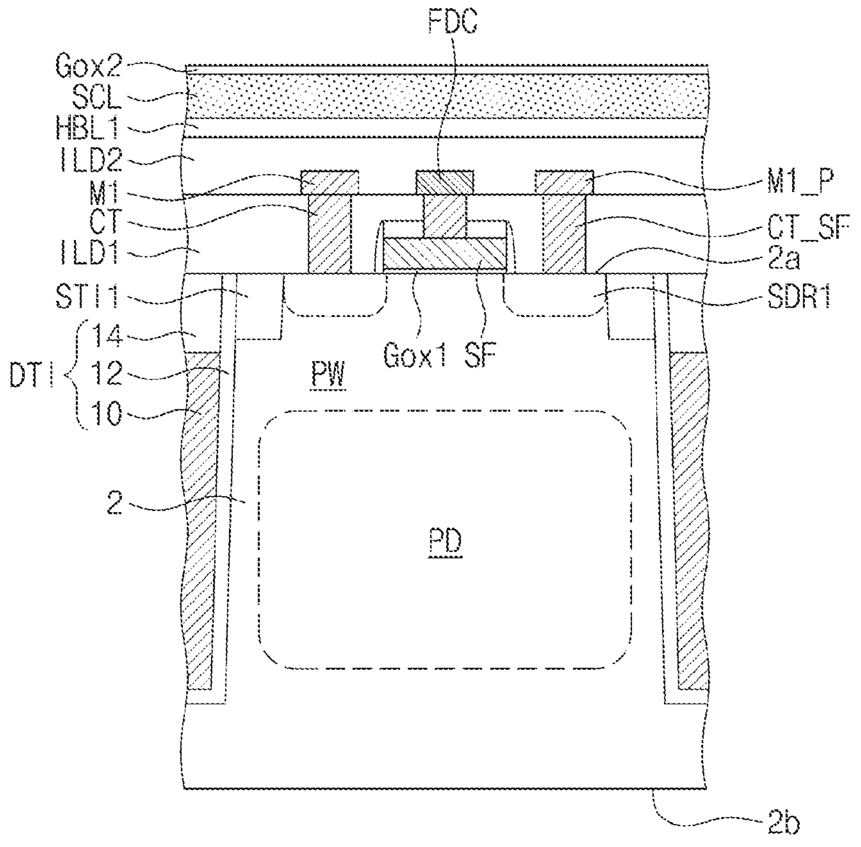

Referring to FIGS. 12A and 12B, a semiconductor layer SCL may be formed on the first hydrogen blocking layer HBL1. The semiconductor layer SCL may be formed as described with reference to FIGS. 1A to 3. A second gate insulating layer Gox2 may be formed on the semiconductor layer SCL.

Figure 13A:
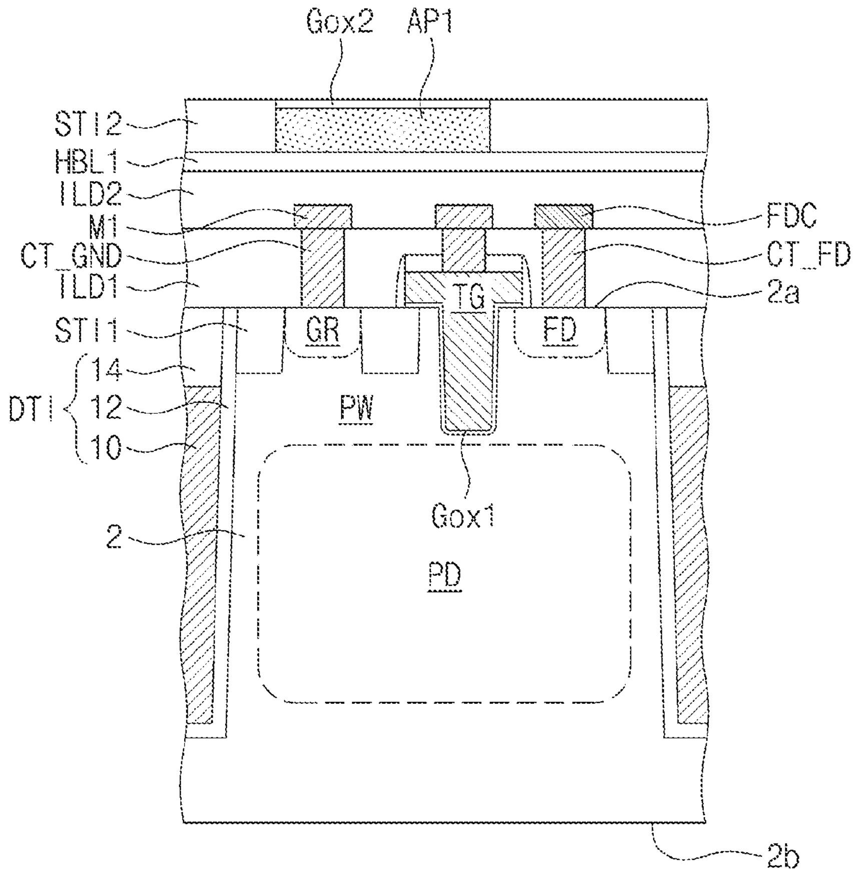
Figure 13B:
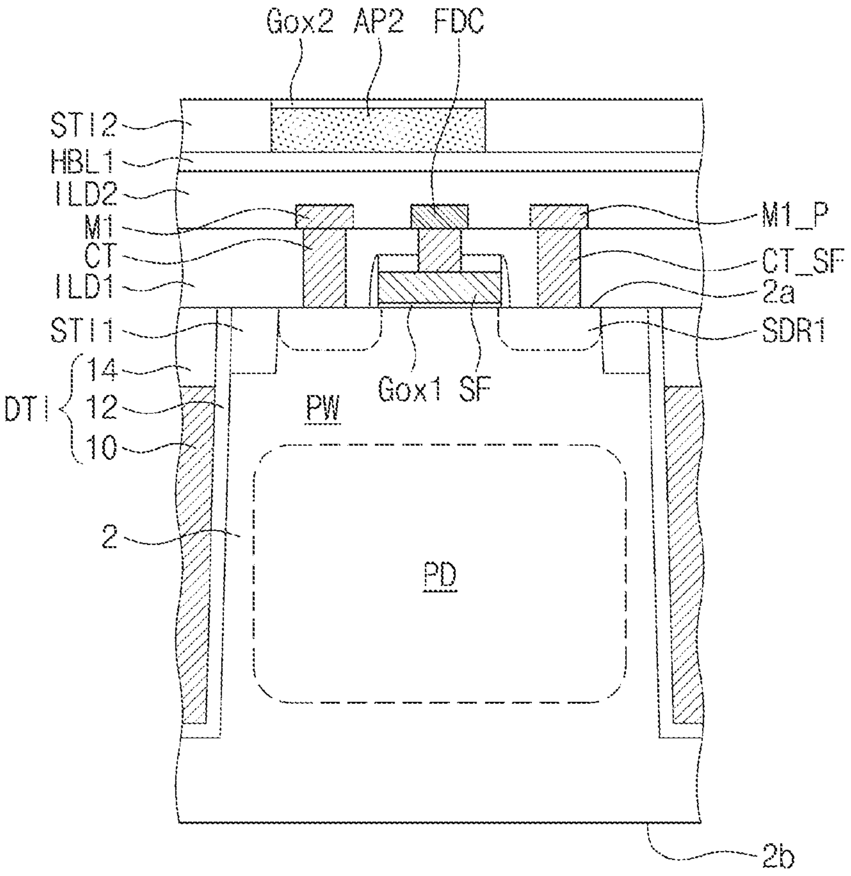

Referring to FIGS. 13A and 13B, the second gate insulating layer Gox2 and the semiconductor layer SCL may be sequentially etched to expose the first hydrogen blocking layer HBL1, and at the same time, to form first and second active patterns AP1 and AP2 spaced apart from each other. At this time, the first hydrogen blocking layer HBL1 may function as an etch stop layer. An insulating layer may be stacked, and a planarization process (e.g., an etch-back process or a CMP process) may be performed on the insulating layer to form a second device isolation layer STI2.

Figure 14A:
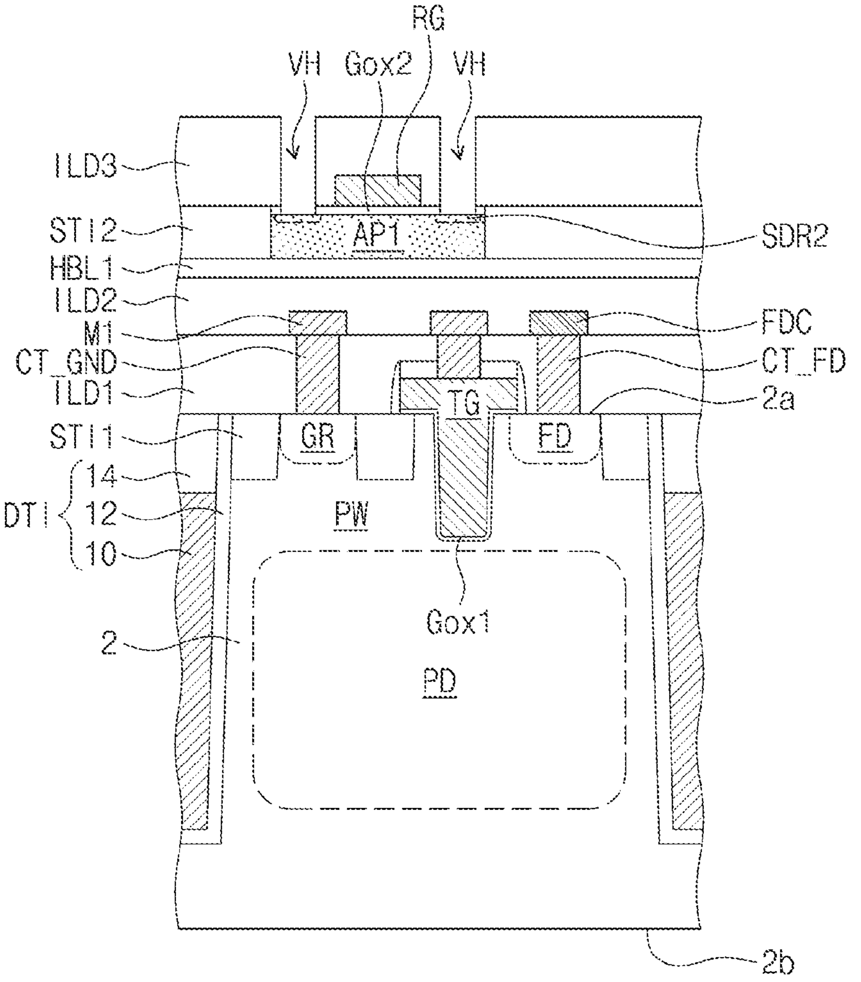
Figure 14B:
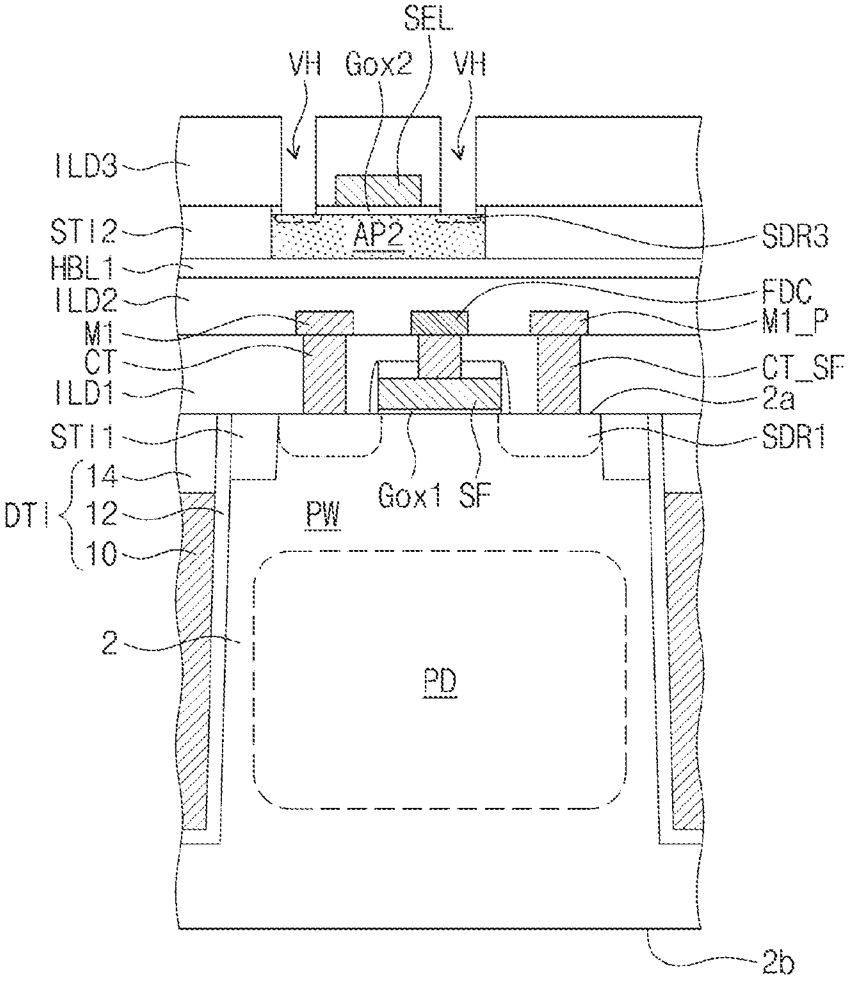

Referring to FIGS. 14A and 14B, a conductive layer may be formed on the second device isolation layer STI2 and the second gate insulating layer Gox2 and then may be patterned to form a reset gate RG and a selection gate SEL. Next, a third interlayer insulating layer ILD3 may be formed and then may be etched to form via holes VH. When the via holes VH are formed, a fluorine containing gas such as $CHF_3$ and/or $CF_4$ may be used as an etchant. In addition, at this time, $H_2$, $N_2$ or Ar may be supplied as a carrier gas. Carbon, hydrogen and/or fluorine atoms constituting $CHF_3$ and/or $CF_4$ supplied as the etchant and/or hydrogen, nitrogen or argon atoms constituting $H_2$, $N_2$ or Ar supplied as the carrier gas may permeate into the active patterns AP1 and AP2 exposed by the via holes VH, thereby forming second and third source/drain regions SDR2 and SDR3. Thus, the second and third source/drain regions SDR2 and SDR3 may include atoms of at least one of carbon, hydrogen, fluorine, nitrogen, or argon. The atoms of at least one of carbon, hydrogen, fluorine, nitrogen or argon, which permeate into the second and third source/drain regions SDR2 and SDR3, may change properties of the second and third source/drain regions SDR2 and SDR3 into an N-type or P-type semiconductor. In some embodiments, a via and the via hole may be referred to as a contact and a contact hole, respectively.

Figure 15A:
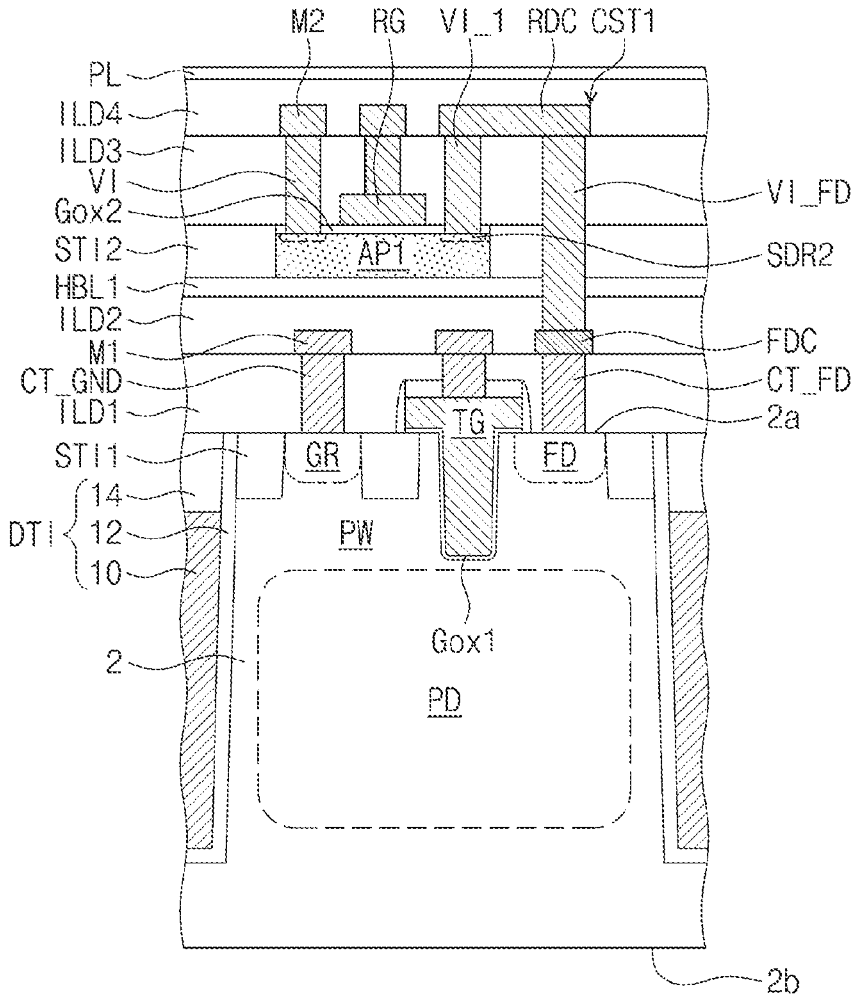
Figure 15B:
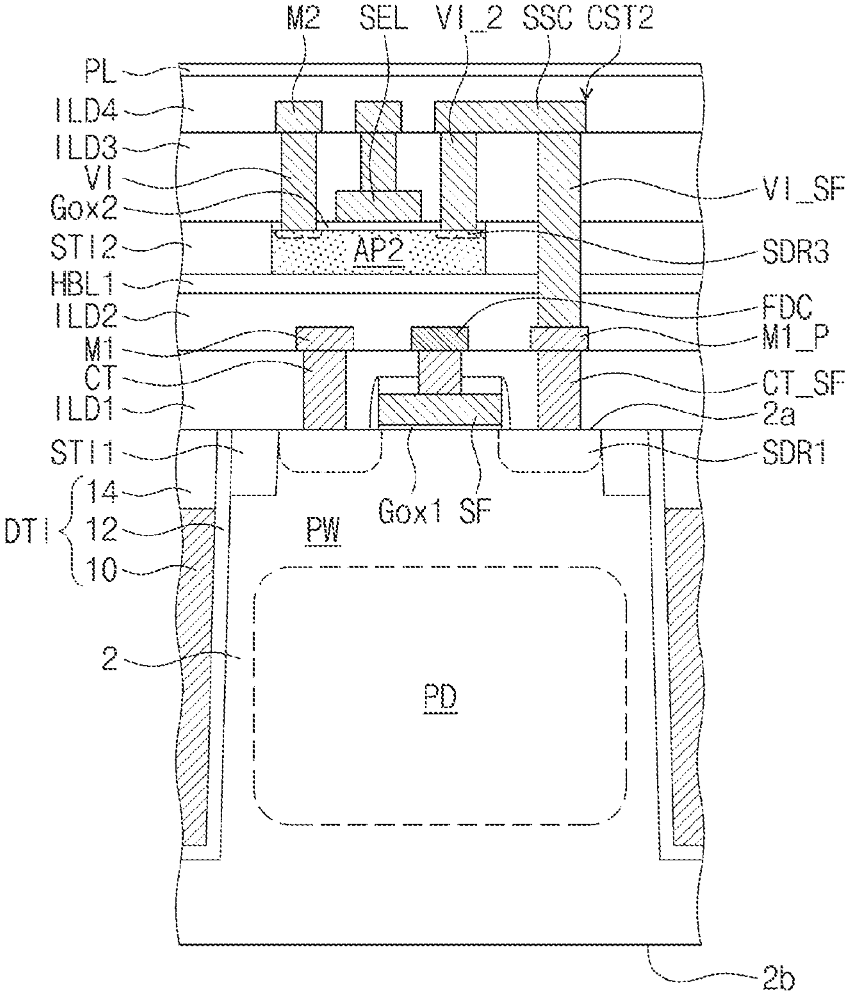

Referring to FIGS. 15A and 15B, vias VI may be formed in the via holes VH. Next, second interconnection lines M2, a fourth interlayer insulating layer ILD4 and a protective layer PL may be formed. Subsequently, referring to FIGS. 10A and 10B, a back grinding process may be performed to remove a portion of the substrate 2 adjacent to the second surface 2*b* and to expose the pixel isolation portion DTI. Next, the fixed charge layer 40, the anti-reflection layer 42, the light blocking pattern 44, the low-refractive index pattern 46, the color filter CF and the micro lens ML may be formed on the second surface 2*b*.

Figure 16A:
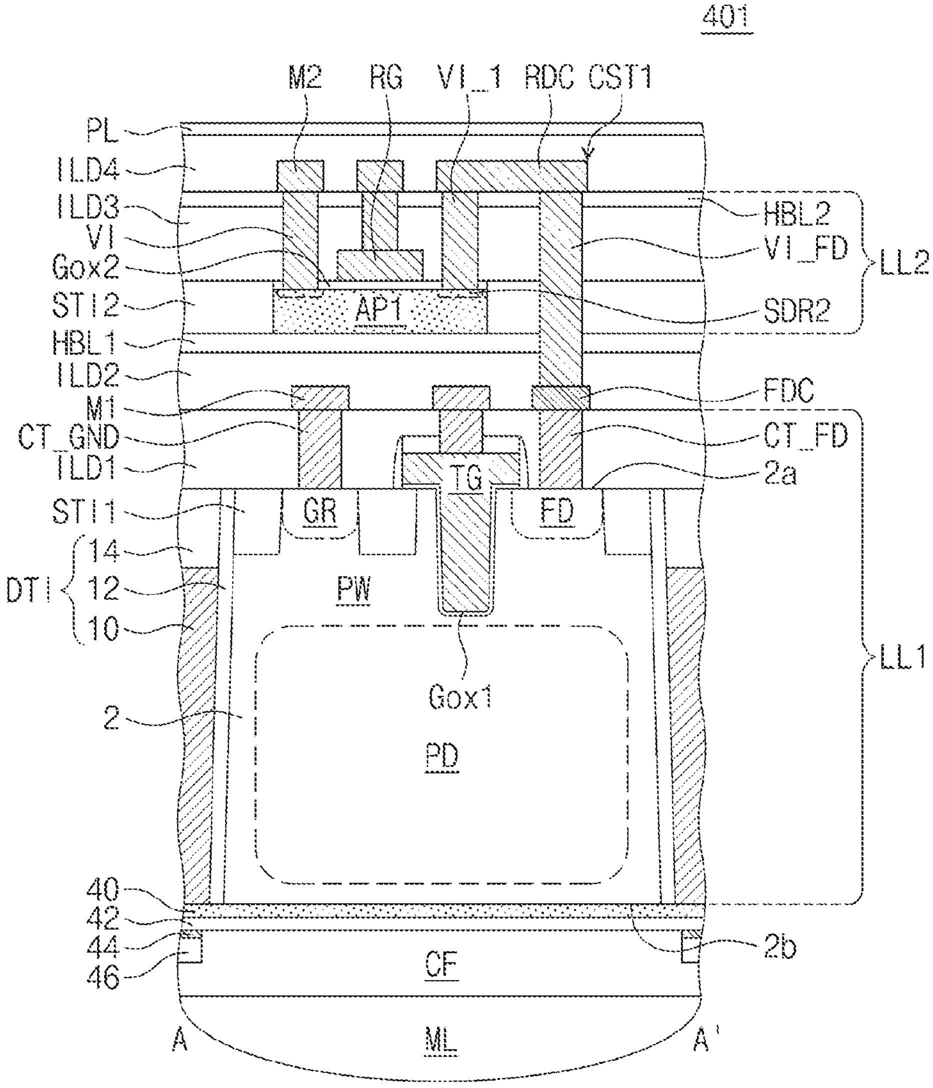
FIG. 16A is a cross-sectional view taken along line A-A' of FIG. 7 according to some embodiments of the inventive concept.
Figure 16B:
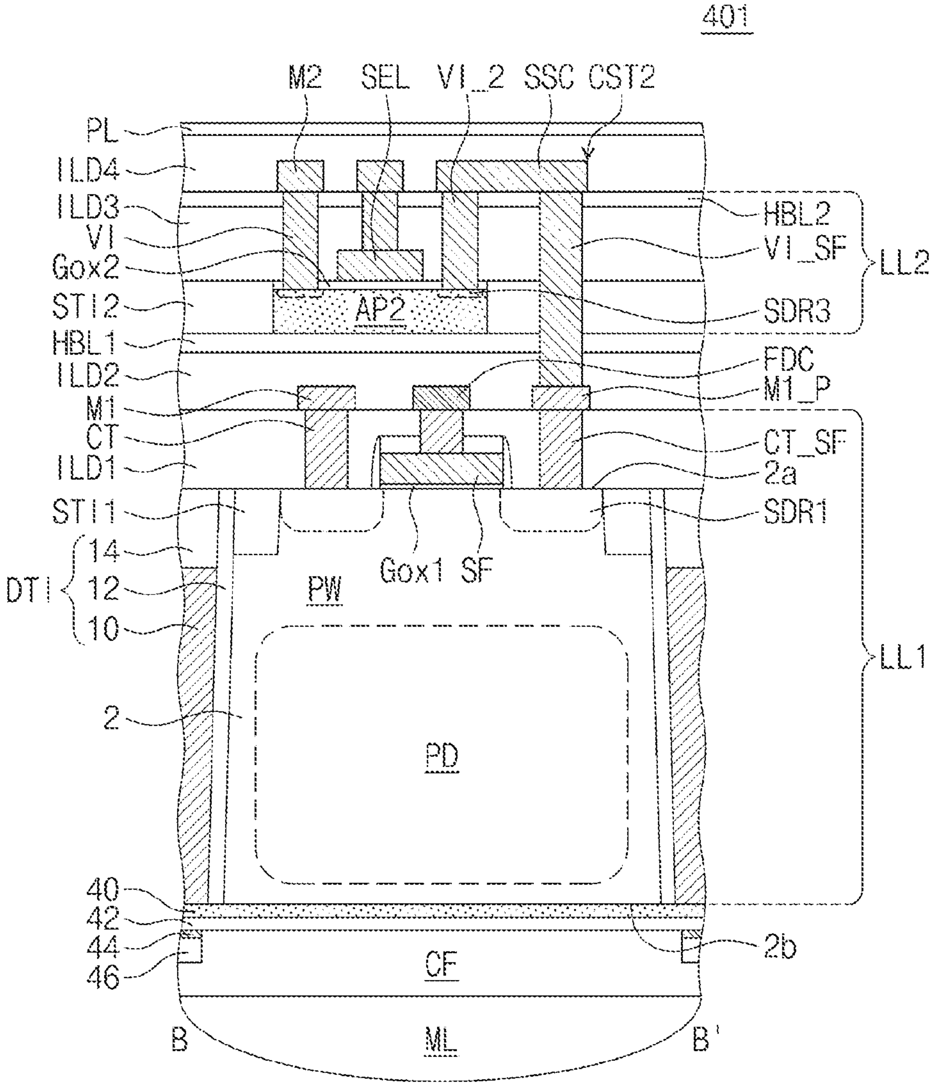
FIG. 16B is a cross-sectional view taken along line B-B' of FIG. 7 according to some embodiments of the inventive concept.

FIG. 16A is a cross-sectional view taken along line A-A' of FIG. 7 according to some embodiments of the inventive concept. FIG. 16B is a cross-sectional view taken along line B-B' of FIG. 7 according to some embodiments of the inventive concept.

Referring to FIGS. 16A and 16B, an image sensor 401 according to some embodiments may further include a second hydrogen blocking layer HBL2 between the third interlayer insulating layer ILD3 and the fourth interlayer insulating layer ILD4. The second hydrogen blocking layer HBL2 may include the same material as the first hydrogen blocking layer HBL1. The second hydrogen blocking layer HBL2 may inhibit or prevent hydrogen included in the fourth interlayer insulating layer ILD4 from permeating into the active patterns AP1 and AP2. Other components may be the same/similar as described with reference to FIGS. 10A and 10B.

Figure 17A:
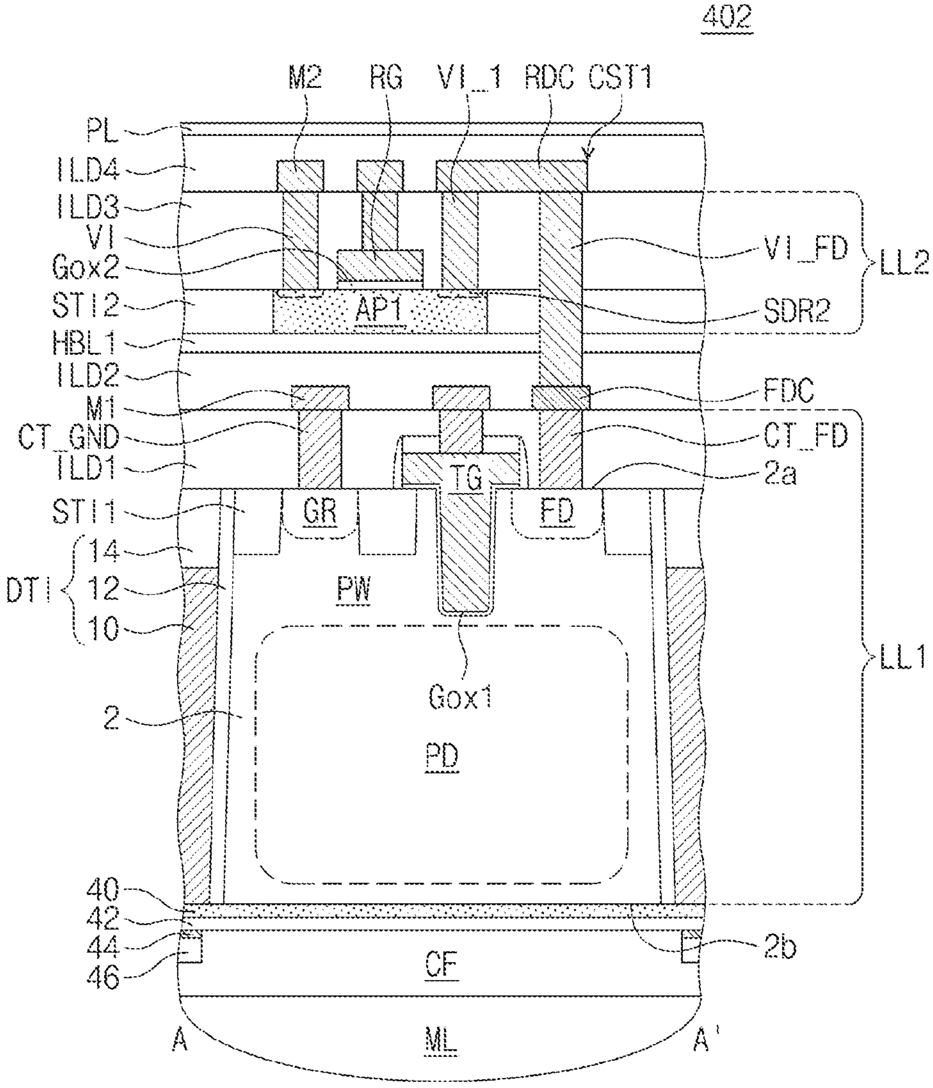
FIG. 17A is a cross-sectional view taken along line A-A' of FIG. 7 according to some embodiments of the inventive concept.
Figure 17B:
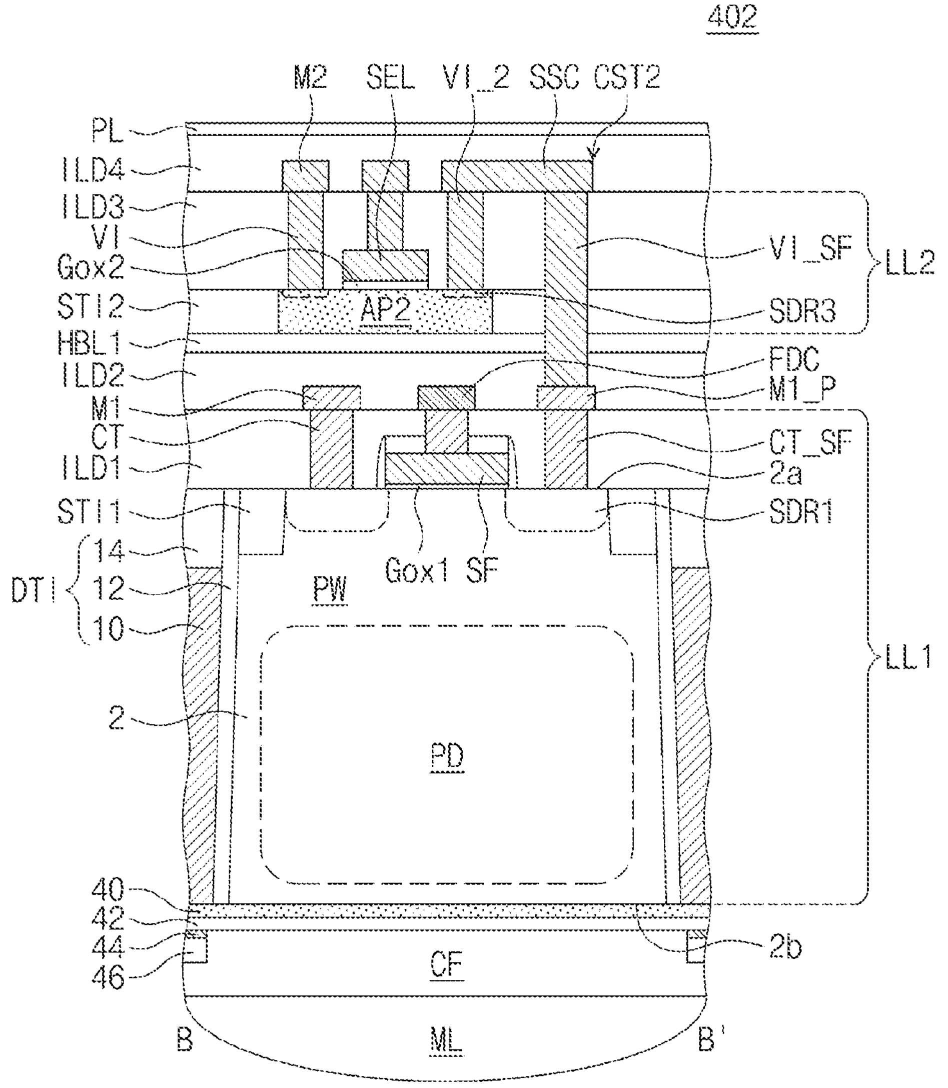
FIG. 17B is a cross-sectional view taken along line B-B' of FIG. 7 according to some embodiments of the inventive concept.

FIG. 17A is a cross-sectional view taken along line A-A' of FIG. 7 according to some embodiments of the inventive concept. FIG. 17B is a cross-sectional view taken along line B-B' of FIG. 7 according to some embodiments of the inventive concept.

Referring to FIGS. 17A and 17B, in an image sensor 402 according to some embodiments, a second gate insulating layer Gox2 may expose top surfaces of the active patterns AP1 and AP2 at both sides of the gates RG and SEL. A sidewall of the second gate insulating layer Gox2 may be substantially aligned with a sidewall of each of the gates RG and SEL. The third interlayer insulating layer ILD3 may be in direct contact with the top surfaces of the active patterns AP1 and AP2. Other components may be the same/similar as described with reference to FIGS. 10A, 10B and 4B.

Figure 18A:
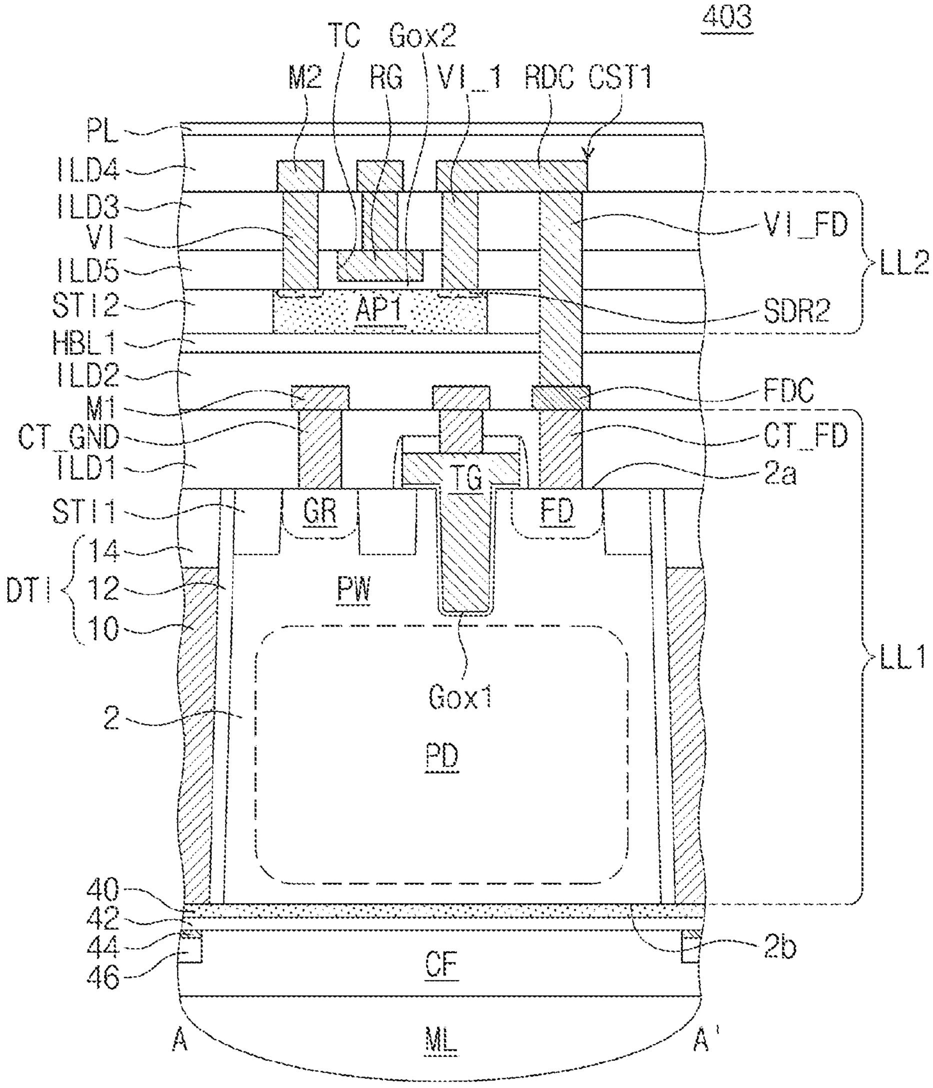
FIG. 18A is a cross-sectional view taken along line A-A' of FIG. 7 according to some embodiments of the inventive concept.
Figure 18B:
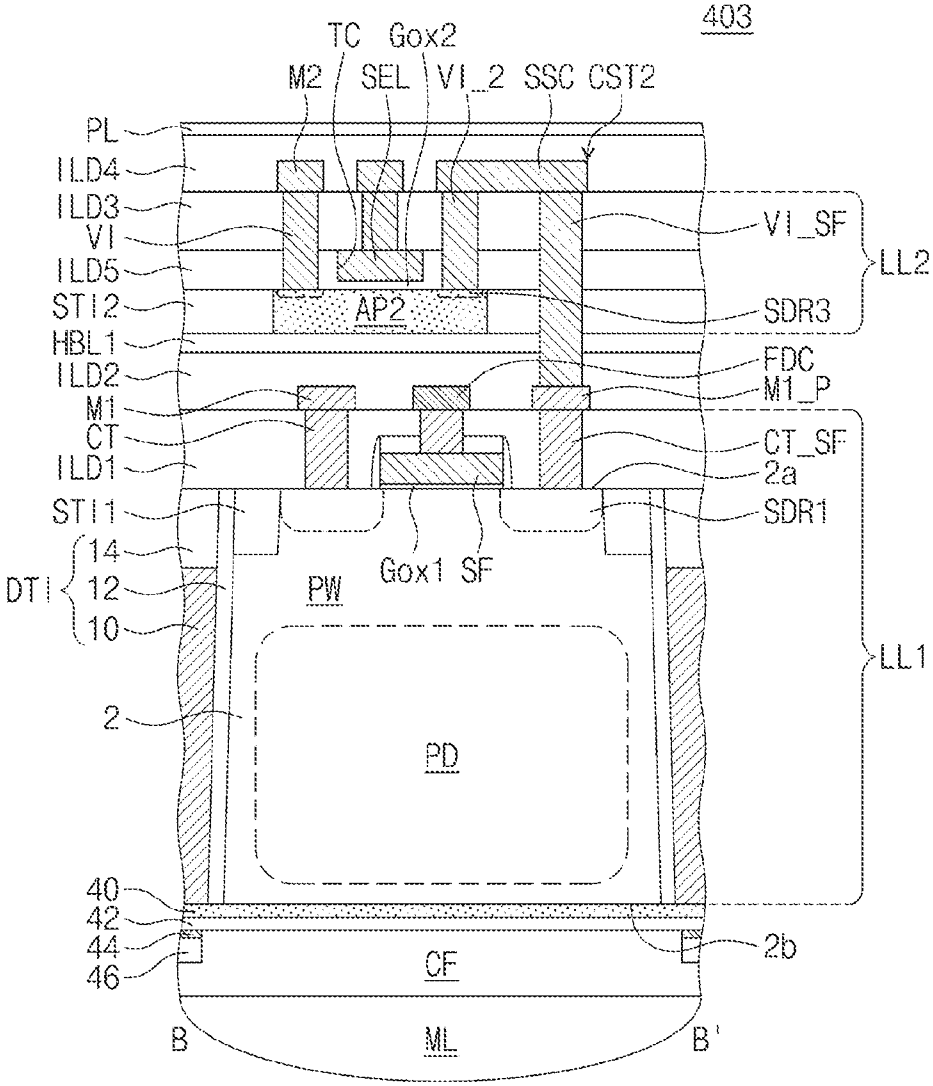
FIG. 18B is a cross-sectional view taken along line B-B' of FIG. 7 according to some embodiments of the inventive concept.

FIG. 18A is a cross-sectional view taken along line A-A' of FIG. 7 according to some embodiments of the inventive concept. FIG. 18B is a cross-sectional view taken along line B-B' of FIG. 7 according to some embodiments of the inventive concept.

Referring to FIGS. 18A and 18B, an image sensor 403 according to some embodiments may further include a fifth interlayer insulating layer ILD5 between the second device isolation layer STI2 and the third interlayer insulating layer ILD3. A portion of the fifth interlayer insulating layer ILD5 may be disposed between the reset gate RG and the first active pattern AP1 and between the selection gate SEL and the second active pattern AP2, and thus, may function as the second gate insulating layer Gox2. Other components and features may be the same/similar as described with reference to FIGS. 10A, 10B and 4C.

Figure 19:
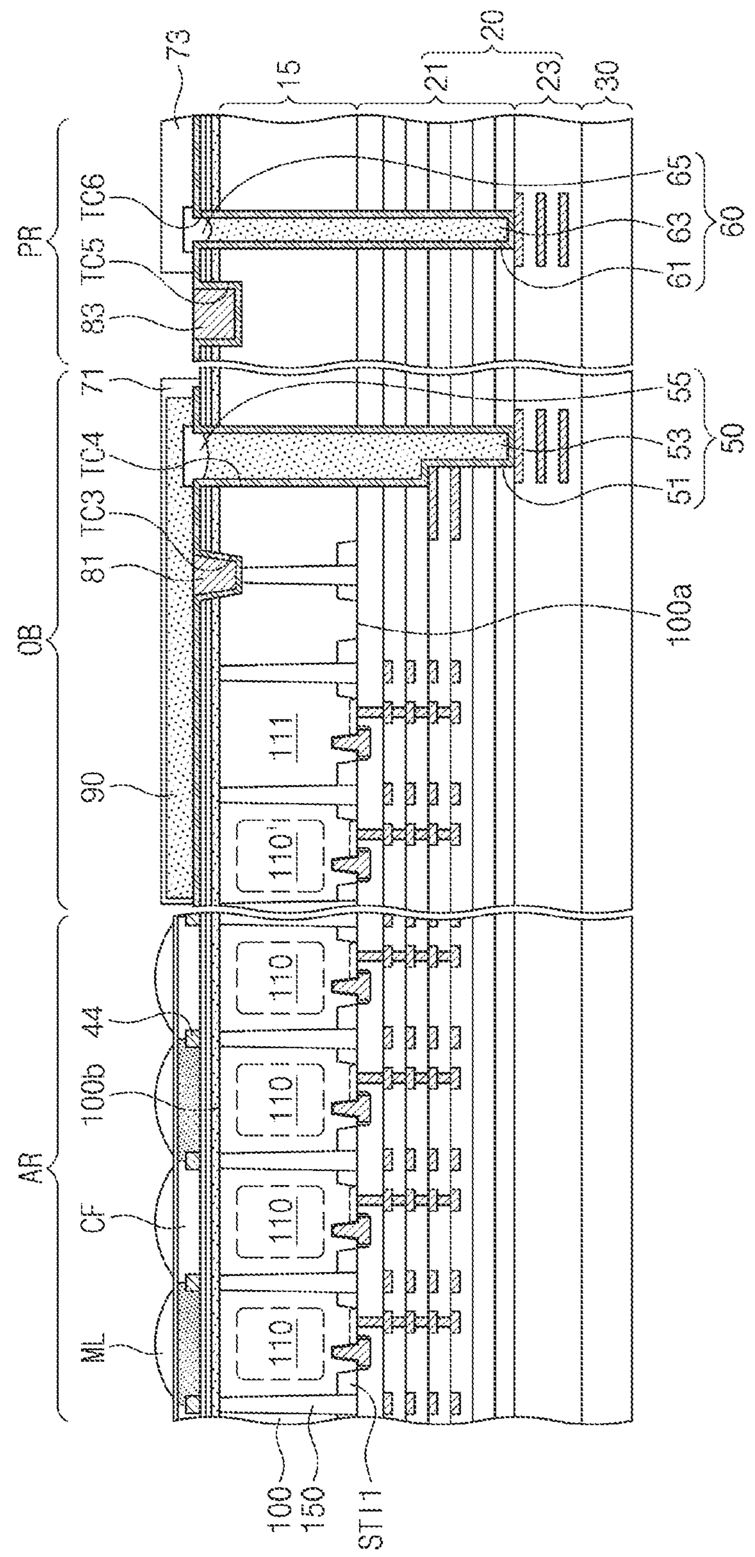
FIG. 19 is a cross-sectional view illustrating an image sensor according to some embodiments of the inventive concept.

FIG. 19 is a cross-sectional view illustrating an image sensor according to some embodiments of the inventive concept.

Referring to FIG. 19, an image sensor according to some embodiments of the inventive concept may include a substrate 100 having a pixel region AR, an optical black region OB, and a pad region PR. The image sensor may include an interconnection layer 20 on a first surface 100*a* of the substrate 100, and a base substrate 30 on the interconnection layer 20. The interconnection layer 20 may include an upper interconnection layer 21 and a lower interconnection layer 23. The pixel region AR may include a plurality of pixels. The pixel region AR may be substantially the same as described above with reference to FIGS. 7 to 18B.

In the optical black region OB, a first connection structure 50, a first conductive pad 81 and a bulk color filter 90 may be provided on the substrate 100. The first connection structure 50 may include a first light blocking pattern 51, an insulating pattern 53, and a first capping pattern 55.

The first light blocking pattern 51 may be provided on a second surface 100*b* of the substrate 100. For example, the first light blocking pattern 51 may cover the second surface 100*b* and may conformally cover inner surfaces of a third trench TC3 and a fourth trench TC4. The first light blocking pattern 51 may penetrate a photoelectric conversion layer 15 and the upper interconnection layer 21 to connect the photoelectric conversion layer 15 and the interconnection layer 20. For example, the first light blocking pattern 51 may be in contact with interconnection lines in the upper and lower interconnection layers 21 and 23 and a pixel isolation portion 150 in the photoelectric conversion layer 15. Thus, the first connection structure 50 may be electrically connected to the interconnection lines in the interconnection layer 20. The first light blocking pattern 51 may include a metal material such as, for example, tungsten. The first light blocking pattern 51 may block light incident to the optical black region OB.

The first conductive pad 81 may be provided in the third trench TC3 to fill a remaining portion of the third trench TC3. The first conductive pad 81 may include a metal material such as, for example, aluminum. The first conductive pad 81 may be connected to the isolation conductive pattern 10 of FIG. 10A. A negative bias voltage may be applied to the isolation conductive pattern 10 through the first conductive pad 81. Thus, a white spot and/or a dark current may be reduced or prevented.

The insulating pattern 53 may fill a remaining portion of the fourth trench TC4. The insulating pattern 53 may penetrate the photoelectric conversion layer 15 and an entire or partial portion of the interconnection layer 20. The first capping pattern 55 may be provided on a top surface of the insulating pattern 53. The first capping pattern 55 may cover the insulating pattern 53.

The bulk color filter 90 may be provided on the first conductive pad 81, the first light blocking pattern 51 and the first capping pattern 55. The bulk color filter 90 may cover the first conductive pad 81, the first light blocking pattern 51, and the first capping pattern 55. A first protective layer 71 may be provided on the bulk color filter 90 to seal or encapsulate the bulk color filter 90.

A photoelectric conversion region 110' and a dummy region 111 may be provided in the substrate 100 of the optical black region OB. For example, the photoelectric conversion region 110' may be doped with dopants having the second conductivity type different from the first conductivity type. The second conductivity type may be, for example, an N-type. The pixel region AR may include a plurality of photoelectric conversion regions 110, which correspond to the photoelectric conversion portions PD in embodiments described above. In some embodiments, the photoelectric conversion region 110' may have a similar structure to that of the photoelectric conversion region 110, but does not perform the same operation (e.g., an operation of receiving light to generate an electrical signal) as the photoelectric conversion region 110. In some embodiments, the dummy region 111 is not doped with dopants. A signal generated from the dummy region 111 may be used as data for removing a process noise.

In the pad region PR, a second connection structure 60, a second conductive pad 83 and a second protective layer 73 may be provided on the substrate 100. The second connection structure 60 may include a second light blocking pattern 61, an insulating pattern 63, and a second capping pattern 65.

The second light blocking pattern 61 may be provided on the second surface 100*b* of the substrate 100. For example, the second light blocking pattern 61 may cover the second surface 100*b* and may conformally cover inner surfaces of a fifth trench TC5 and a sixth trench TC6. The second light blocking pattern 61 may penetrate the photoelectric conversion layer 15 and the upper interconnection layer 21 to connect the photoelectric conversion layer 15 and the interconnection layer 20. For example, the second light blocking pattern 61 may be in contact with the interconnection line in the lower interconnection layer 23. Thus, the second connection structure 60 may be electrically connected to the interconnection lines in the interconnection layer 20. The second light blocking pattern 61 may include a metal material such as, for example, tungsten.

The second conductive pad 83 may be provided in the fifth trench TC5 to fill a remaining portion of the fifth trench TC5. The second conductive pad 83 may include a metal material such as, for example, aluminum. The second conductive pad 83 may function as an electrical connection path between the image sensor and an external device. The insulating pattern 63 may fill a remaining portion of the sixth trench TC6. The insulating pattern 63 may penetrate the photoelectric conversion layer 15 and an entire or partial portion of the interconnection layer 20. The second capping pattern 65 may be provided on the insulating pattern 63. The second protective layer 73 may cover a portion of the second light blocking pattern 61 and the second capping pattern 65.

A current applied through the second conductive pad 83 may flow to the pixel isolation portion 150, which corresponds to the pixel isolation portion DTI in embodiments described above, through the second light blocking pattern 61, the interconnection lines in the interconnection layer 20, and the first light blocking pattern 51. Electrical signals generated from the photoelectric conversion regions 110 and 110' and the dummy region 111 may be transmitted to an external device through the interconnection lines in the interconnection layer 20, the second light blocking pattern 61, and the second conductive pad 83.

According to embodiments of the inventive concept, the metal oxide semiconductor layer doped with nitrogen may be formed by performing the ALD, PEALD, CVD or PECVD process using $N_2O$ as a precursor of oxygen and nitrogen, and thus, the semiconductor layer may have a substantially uniform nitrogen content profile.

In the semiconductor device or image sensor including the transistor using the semiconductor layer as the active pattern according to some embodiments, a change in threshold voltage of the transistor due to light may be reduced or minimized to increase reliability (e.g., optical reliability).

In addition, in the image sensor according to some embodiments of the inventive concept, the reset transistor or the selection transistor may be disposed on the transfer transistor to increase integration density.

While the inventive concept has been particularly shown and described with reference to embodiments thereof, it will be understood by those of ordinary skill in the art that various changes in form and detail may be made therein without departing from the spirit and scope of the inventive concept as defined by the following claims.

What is claimed is:

1. An image sensor, comprising:

a substrate comprising a plurality of pixels and having a first surface and a second surface opposite to the first surface;

a photoelectric conversion portion disposed in the substrate in each of the pixels;

a transfer gate disposed on the first surface of the substrate in each of the pixels;

a first interlayer insulating layer covering the substrate and the transfer gate;

a first hydrogen blocking layer including only a single layer, disposed on the first interlayer insulating layer, and comprising SiOC or $Al_2O_3$;

a first active pattern directly contacting the SiOC or the $Al_2O_3$ of the first hydrogen blocking layer and comprising a metal oxide doped with nitrogen;

a first gate disposed on the first active pattern;

a second interlayer insulating layer covering the first gate and the first active pattern; and upper source/drain contacts penetrating the second interlayer insulating layer and contacting the first active pattern at two sides of the first gate, wherein a hydrogen concentration of the first hydrogen blocking layer is less than a hydrogen concentration of the first interlayer insulating layer, a difference between a content of the nitrogen at a top end of the first active pattern and a content of the nitrogen at a bottom end of the first active pattern is within a range from about 0.0 at % to about 0.1 at %, and a content of the nitrogen in the first active pattern is within a range from about 0.1 at % to about 5.0 at %.

2. The image sensor of claim 1, further comprising:

a floating diffusion region disposed in the substrate at a side of the transfer gate in each of the pixels; and an interconnection structure penetrating the first interlayer insulating layer, the first hydrogen blocking layer and the second interlayer insulating layer, and connecting the floating diffusion region to one of the upper source/drain contacts, wherein the first gate is a reset gate.

3. The image sensor of claim 1, further comprising:

a source follower gate disposed on the first surface of the substrate in each of the pixels and spaced apart from the transfer gate;

a lower source/drain region disposed in the substrate at a side of the source follower gate; and an interconnection structure penetrating the first interlayer insulating layer, the first hydrogen blocking layer and the second interlayer insulating layer, and connecting the lower source/drain region to one of the upper source/drain contacts, wherein the first gate is a selection gate.

4. The image sensor of claim 1, further comprising:

upper source/drain regions in contact with bottom surfaces of the upper source/drain contacts and disposed in the first active pattern, wherein the upper source/drain regions comprise at least one of hydrogen, fluorine, or argon.

5. The image sensor of claim 1, further comprising:

a gate insulating layer disposed between the first active pattern and the first gate, and covering an entire top surface of the first active pattern, wherein the gate insulating layer comprises aluminum oxide.

6. The image sensor of claim 1, further comprising:

a second hydrogen blocking layer disposed on the second interlayer insulating layer.

7. The image sensor of claim 1, wherein a portion of the second interlayer insulating layer is a gate insulating layer disposed between the first gate and the first active pattern.

8. The image sensor of claim 1, wherein a top surface and a sidewall of the first gate are in contact with the second interlayer insulating layer.

9. The image sensor of claim 8, further comprising:

a gate capping pattern disposed on the transfer gate; and a gate spacer covering a sidewall of the transfer gate.

10. The image sensor of claim 1, wherein the metal oxide comprises at least one metal of In, Ga, Zn, or Sn.

11. An image sensor, comprising:

a substrate comprising a plurality of pixels and having a first surface and a second surface opposite to the first surface;

a pixel isolation portion disposed in the substrate, wherein the pixel isolation portion isolates the pixels from each other;

a photoelectric conversion portion disposed in the substrate in each of the pixels;

a transfer gate disposed on the first surface of the substrate in each of the pixels;

a floating diffusion region disposed in the substrate at a side of the transfer gate in each of the pixels;

a first interlayer insulating layer covering the substrate and the transfer gate;

a first hydrogen blocking layer including only a single layer, disposed on the first interlayer insulating layer, and comprising SiOC or $Al_2O_3$;

a first active pattern directly contacting the SiOC or the $Al_2O_3$ of the first hydrogen blocking layer, wherein the first active pattern comprises a metal oxide doped with nitrogen;

a first gate disposed on the first active pattern;

a second interlayer insulating layer covering the first gate and the first active pattern; and upper source/drain contacts penetrating the second interlayer insulating layer and contacting the first active pattern at two sides of the first gate, wherein a hydrogen concentration of the first hydrogen blocking layer is less than a hydrogen concentration of the first interlayer insulating layer, a difference between a content of the nitrogen at a top end of the first active pattern and a content of the nitrogen at a bottom end of the first active pattern is within a range from about 0.0 at % to about 0.1 at %, and a content of the nitrogen in the first active pattern is within a range from about 0.1 at % to about 5.0 at %.

12. The image sensor of claim 11, further comprising:

an interconnection structure penetrating the first interlayer insulating layer, the first hydrogen blocking layer and the second interlayer insulating layer, and connecting the floating diffusion region to one of the upper source/drain contacts, wherein the first gate is a reset gate.

13. The image sensor of claim 11, further comprising:

a source follower gate disposed on the first surface of the substrate in each of the pixels and spaced apart from the transfer gate;

a lower source/drain region disposed in the substrate at a side of the source follower gate; and an interconnection structure penetrating the first interlayer insulating layer, the first hydrogen blocking layer and the second interlayer insulating layer, and connecting the lower source/drain region to one of the upper source/drain contacts, wherein the first gate is a selection gate.

* * * * *